(12) United States Patent
Kanaya et al.

(10) Patent No.: US 6,982,444 B2
(45) Date of Patent: Jan. 3, 2006

(54) FERROELECTRIC MEMORY DEVICE HAVING A HYDROGEN BARRIER FILM

(75) Inventors: Hiroyuki Kanaya, Yokohama (JP); Iwao Kunishima, Yokohama (JP); Koji Yamakawa, Kawasaki (JP); Tsuyoshi Iwamoto, Urayasu (JP); Hiroshi Mochizuki, Musashino (JP); Yoshinori Kumura, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 10/443,107

(22) Filed: May 22, 2003

(65) Prior Publication Data

US 2004/0056290 A1 Mar. 25, 2004

Related U.S. Application Data

(62) Division of application No. 09/359,324, filed on Jul. 23, 1999, now Pat. No. 6,586,790.

(30) Foreign Application Priority Data

| Jul. 24, 1998 | (JP) | ............................................ | 10-208999 |
| Nov. 13, 1998 | (JP) | ............................................ | 10-324254 |
| Dec. 4, 1998 | (JP) | ............................................ | 10-345368 |

(51) Int. Cl.
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |

(52) U.S. Cl. ........................ 257/295; 257/306; 257/310; 257/311

(58) Field of Classification Search ......... 257/295–296, 257/303–304, 306, 310–311; 438/3, 393, 438/396
See application file for complete search history.

(56) References Cited

U.S. PATENT DOCUMENTS

| 5,396,095 A | 3/1995 | Wolters et al. |
| 5,438,023 A | 8/1995 | Argos et al. |
| 5,624,864 A | 4/1997 | Arita et al. |

(Continued)

FOREIGN PATENT DOCUMENTS

| JP | 07-111318 | 4/1995 |
| JP | 08-017806 | 1/1996 |
| JP | 08-017822 | 1/1996 |

(Continued)

OTHER PUBLICATIONS

International Symposium on Integrated Ferroelctrics 99, ABSTRACTS, Hiroyuki Kanaya, et al., "Hydrogen–induced Imprint Mechanism of Pt/PZT/Pt Capacitor by Low–temperature Hydrogen Treatment", Mar. 7–10, 1999, p. 113C.

*Primary Examiner*—Shouxiang Hu
(74) *Attorney, Agent, or Firm*—Banner & Witcoff, Ltd.

(57) ABSTRACT

There is provided a semiconductor device having a ferroelectric capacitor formed on a semiconductor substrate covered with an insulator film, wherein the ferroelectric capacitor comprises: a bottom electrode formed on the insulator film; a ferroelectric film formed on the bottom electrode; and a top electrode formed on the ferroelectric film. The ferroelectric film has a stacked structure of either of two-layer-ferroelectric film or three-layer-ferroelectric film. The upper ferroelectric film is metallized and prevents hydrogen from diffusing in lower ferroelectric layer. Crystal grains of the stacked ferroelectric films are preferably different.

12 Claims, 40 Drawing Sheets

U.S. PATENT DOCUMENTS

| | | |
|---|---|---|
| 5,902,131 A | 5/1999 | Argos et al. |
| 6,188,098 B1 | 2/2001 | Amanuma |
| 6,249,014 B1 * | 6/2001 | Bailey ........................ 257/295 |
| 6,316,798 B1 | 11/2001 | Ogata et al. |

FOREIGN PATENT DOCUMENTS

| | | |
|---|---|---|
| JP | 08-050960 | 2/1996 |
| JP | 08-055967 | 2/1996 |
| JP | 08-335676 | 12/1996 |
| JP | 08-340090 | 12/1996 |
| JP | 09-266200 | 10/1997 |
| JP | 09-282943 | 10/1997 |
| JP | 09-321234 | 12/1997 |
| JP | 10-050960 | 2/1998 |
| JP | 10-223855 | 8/1998 |
| JP | 11-121704 | 4/1999 |
| WO | WO 96/29727 | 9/1996 |
| WO | WO 97/35341 | 9/1997 |

* cited by examiner

FERROELECTRIC MEMORY DEVICE HAVING A HYDROGEN BARRIER FILM

CROSS-REFERENCE TO RELATED APPLICATION

This application is a divsional of U.S. patent application Ser. No. 09/359,324 filed Jul. 23, 1999, now U.S. Pat. No. 6,586,790, which is based upon and claims the benefit of priority from the prior Japanese Patent Application Nos. 208999/1998, filed Jul. 24, 1998; 324254/1998, filed Nov. 13, 1998; and 345368/1998, filed Dec. 4, 1998, the entire contents of which are incorporated herein by reference.

BACKGROUND OF THE INVENTION

1. Field of the Invention

The present invention relates generally to a semiconductor device including a ferroelectric capacitor having a thin-film structure and a method of manufacturing the same.

2. Related Background Art

There is known a non-volatile semiconductor memory device using a ferroelectric capacitor (which will be hereinafter referred to as a "ferroelectric memory"). The ferroelectric capacitor is formed by stacking a bottom electrode, a ferroelectric film and a top electrode on a substrate. A typical ferroelectric film is formed of a perovskite compound, such as lead zirconate titanate (PZT; $PbZr_xTi_{1-x}O_3$) ($0<x<1$), which has a perovskite type crystal structure. When a PZT film is used, a platinum (Pt) film is typically used as each of the bottom and top electrodes. The ferroelectric memory is capable of non-volatile storing data by the spontaneous polarization (remnant polarization) of the ferroelectric.

Such a ferroelectric memory is capable of holding data without the need of any batteries and of operating at a high speed, so that it begins being applied to a non-contact card (RF-ID; Radio Frequency-Indication) and so forth. The ferroelectric memory is also exactly expected to be substituted for the existing SRAM, EEPROM flash memory, DRAM or the like, and to be applied to a logic mixed memory.

However, in the conventional ferroelectric capacitor using PZT, hydrogen causes the decreases of the amount of spontaneous polarization, so that the signal margin in FRAM is decreased resulting in the bit failure of the memory, and the decrease of reliability and yield of the whole memory.

It has been reported that the spontaneous polarization of a ferroelectric capacitor having a Pt/PZT/Pt structure is degraded by annealing in an atmosphere of $H_2$ (e.g., J. Appl. Phys. Vol. 82, No. 1, July 1997, pp. 341–344). On the other hand, although a technique for improving the characteristics of a ferroelectric capacitor by decreasing the concentration of hydrogen in the ferroelectric capacitor is disclosed in, e.g., Japanese Patent Laid-Open No. 8-8404(1996), this technique is not realistic since there is a strict limit to a process.

In addition, a basic process for manufacturing the above described ferroelectric capacitor having the Pt/PZT/Pt structure comprises the steps of: sequentially depositing a bottom Pt electrode and a PZT film on a substrate; carrying out a heat treatment for crystallizing the deposited PZT film; and forming a top Pt electrode on the PZT film.

It has been also reported that the spontaneous polarization of the ferroelectric capacitor having the Pt/PZT/Pt structure is degraded by a heat treatment in an atmosphere of hydrogen. This is caused by the fact that a large amount of oxygen vacancy is introduced into the PZT film by the reducing power of hydrogen and the catalysis of the Pt electrode.

On the other hand, it has been revealed by the inventor's recent study that when the PZT film is deposited on the bottom Pt electrode to be crystallized, Pt is diffused into PZT film from the bottom Pt electrode in deep range of the PZT film to form a conductive layer. Because the state of PZT film is an amorphous state so that the rate of the diffusion reaction thereof is high when the PZT film is deposited.

In particular, if the thickness of the PZT film is intended to be decreased to 100 nm or less, most of the PZT film becomes the conductive layer. Therefore, it is difficult to carry out the scaling of the thickness of the ferroelectric film.

FIG. 1 shows an example of the processed shape of a ferroelectric capacitor on a substrate 71. In order to achieve the scale down and high integration of a memory, a bottom Pt electrode 72, a PZT film 73 and a top Pt electrode 74 are preferably sequentially etched in substantially vertical directions to form a ferroelectric capacitor as shown in FIG. 1. However, if it is intended to obtain such a shape of capacitor, there is a problem in that Pt splashed by etching the bottom Pt electrode 72 is adhered to the side wall of the PZT film 73 again to form a Pt fence to establish a short-circuit between the top and bottom electrodes.

Moreover, as shown in FIG. 2, the ferroelectric capacitor is finally covered with a passivation film 75, and connected to an interconnection 76. In this structure, the end portion of the layer between the PZT film 73 and the bottom Pt electrode 72 directly contacts the passivation film 75. Therefore, when hydrogen annealing is carried out, hydrogen passing through the passivation film 75 penetrates into the layer between the PZT film 73 and the bottom Pt electrode 72 to cause degradation, such as the decrease of the amount of polarization and the peeling of films, with age.

It has been known that the characteristics of the ferroelectric capacitor are degraded by hydrogen during a process for manufacturing an Si-LSI, specifically that the amount of polarization thereof is decreased by hydrogen during the process. In addition, it has been proposed that a $TiO_2$ film, an $Al_2O_3$ film or the like can be effectively used as a protective film for protecting the ferroelectric capacitor against such penetrating hydrogen (e.g., see IEDM 97-609-612, IEDM 97-617-620). However, in the shape that the layer between the PZT film 73 and the bottom Pt electrode 72 is continued from the surface of the bottom Pt electrode 72 extending to the outside of the PZT film 73 as shown in FIG. 2, even if the hydrogen protecting film is provided, it is difficult to interrupt the reducing element, such as hydrogen, which penetrates into the layer between the PZT film 73 and the bottom Pt electrode 72 along the surface of the bottom Pt electrode 72, so that it is not possible to surely prevent the degradation in characteristics.

SUMMARY OF THE INVENTION

It is therefore a primary object of the present invention to eliminate the aforementioned problems and to provide a semiconductor device having a ferroelectric capacitor having a small degradation in characteristics, and a method for manufacturing the same.

In a semiconductor integrated circuit according to one aspect of the present invention, the dielectric film of a capacitor has a two-layer structure, which comprises a first metal oxide, for example, $BSTO(Ba_{1-x}Sr_xTiO_3)$, dielectric film on the side of a bottom electrode, and a second metal oxide dielectric film. The first metal oxide film is crystallized after it is deposited on the bottom electrode. If the dielectric film has such a stacked dielectric film structure, the constituent element of the bottom electrode is diffused in the first metal oxide film at the step of crystallizing the first metal oxide dielectric film, and the first metal oxide dielectric film is crystallized so as to contain the constituent element of the bottom electrode. Then, when the first metal oxide dielectric film is crystallized, the constituent element of the bottom electrode incorporated into the first metal oxide dielectric film can hardly move so that the constituent element of the bottom electrode is hardly diffused even at the step of crystallizing the second metal oxide dielectric film deposited on the first metal oxide dielectric film. In addition, if the second metal oxide dielectric film is crystallized before the top electrode is deposited, the constituent element of the top electrode is not diffused in the second metal oxide dielectric film. Therefore, in the case of a ferroelectric capacitor having first and second metal oxide films of ferroelectric films, the second metal oxide film has a good ferroelectric characteristic having no leak, so that it is possible to obtain a ferroelectric capacitor having a large spontaneous polarization. In addition, since the constituent element of the bottom electrode Is not diffused in the second metal oxide dielectric film, it is possible to easily decrease the thickness of the second metal oxide film.

Even in the case of a high-dielectric capacitor wherein each of the first and second metal oxide films is a high-dielectric film, it is possible to obtain an excellent capacitor characteristic having a small leak for the same reason, so that it is possible to decrease the thickness of the high-dielectric film.

It is to be noted that the first and second metal oxide dielectric films are interpreted as ferroelectric materials throughout the specification.

In a semiconductor integrated circuit according to another aspect of the present invention, in addition to the first and second metal oxide dielectric films described above, a third metal oxide dielectric film is provided between the above described second metal oxide dielectric film and the top electrode. In this case, if the third metal oxide dielectric film is crystallized after the top electrode is deposited thereon, the third metal oxide dielectric film is crystallized so as to contain the constituent element of the top electrode similar to the first metal oxide dielectric film. Therefore, the third metal oxide dielectric film serves as a metallic layer against the reducing power due to hydrogen or the like from the top of the second metal oxide dielectric film. Thus, it is possible to more effectively inhibit the characteristics of the ferroelectric capacitor from being degraded by the reducing gas.

It is a further object of the present invention to provide a semiconductor device having a ferroelectric capacitor which can effectively inhibit the damage to the layer between a ferroelectric film and a bottom electrode, and the peeling of films and which can reduce the degradation in remnant polarization, and a method for manufacturing the same.

In the ferroelectric capacitor according to the present invention, although the bottom electrode is patterned so as to extend to the outside of the ferroelectric film, a part of the surface portion of the bottom electrode is removed by over etching when the ferroelectric film is patterned, so that the level of the surface of the extending portion of the bottom electrode is lower than that of the layer between the ferroelectric film and the bottom electrode. Moreover, the protective film against hydrogen gas and a halogen gas is formed so as to cover a region extending from the surface of the bottom electrode to the sides of the ferroelectric film and top electrode. Thus, it is possible to effectively inhibit the reducing element from penetrating into the layer between the ferroelectric film and the bottom electrode, so that it is possible to obtain a reliable ferroelectric capacitor, the remnant polarization of which does not decrease, which will result in improvement of electrical property for FRAMS, and decrease of leak of charges and improvement in adaptability for scaling for DRAM

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the attached drawings:

FIGS. 3A–3F are sectional views showing steps of forming a bottom electrode of a preferred embodiment of a ferroelectric capacitor according to the present invention, wherein FIG. 3A shows a step of forming a bottom electrode, FIG. 3B shows a step of depositing a first PZT film, FIG. 3C shows a step of crystallizing the first PZT film, FIG. 3D shows a step of depositing a second PZT film, FIG. 3E shows a step of forming a top electrode and FIG. 3F shows a step of crystallizing the second PZT film, respectively;

DESCRIPTION OF THE PREFERRED EMBODIMENTS

Referring now to the accompanying drawings, the preferred embodiments of the present invention will be described below.

Figure 15:
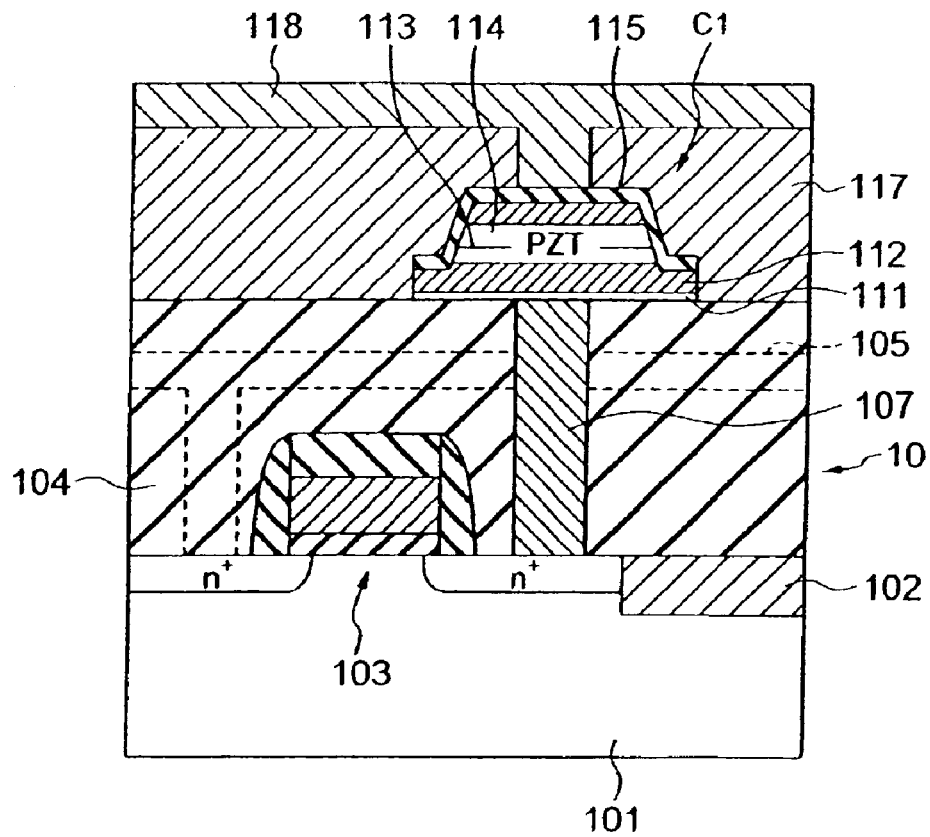
FIG. 15 is a sectional view showing a memory cell structure in the first preferred embodiment.

In the following description, most of the embodiments show only the capacitor part. It is to be noted that contact plugs, interconnections, MOS transistors, etc. are generally provided as shown in FIG. 15 which will be described later, but in other Figures, they are omitted.

Figure 3A:
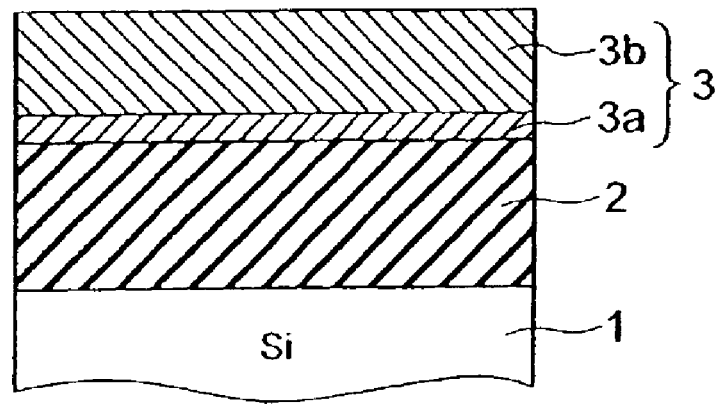

FIGS. 3A through 3E show a process for manufacturing a first preferred embodiment of a ferroelectric capacitor on a silicon substrate. In FIG. 3A, elements, such as MOS transistors, are formed on a silicon substrate 1, and a silicon oxide (SiO$_2$) film 2 for covering the MOS transistor is formed thereon. On the silicon oxide film 2, an adhesion film 3a having a thickness of 20 nm is deposited by a sputtering method, and subsequently, a Pt film 3b having a thickness of 20 nm is deposited by a sputtering method to form a bottom electrode 3 of a Pt/adhesion stacked film.

Figure 3B:
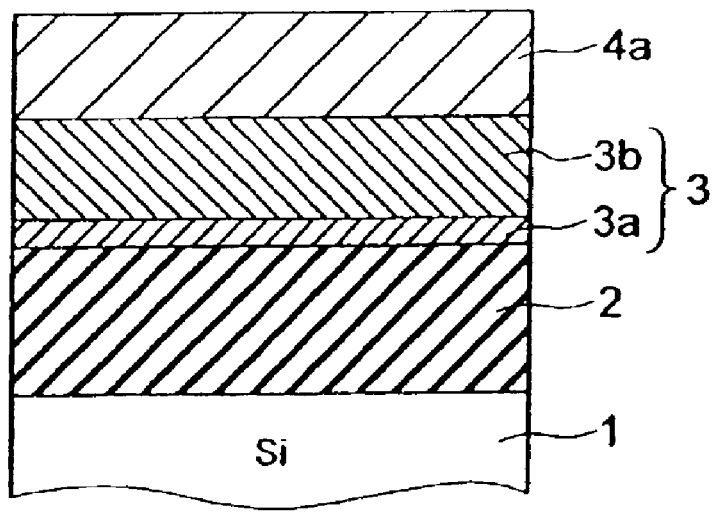

Subsequently, as shown in FIG. 3B, a first PZT film 4a having a thickness of 250 nm serving as a ferroelectric film is deposited on the bottom electrode 3 by the sol-gel method or sputtering method. Then, at this stage, a heat treatment (RTA) is carried out at 750° C. in an atmosphere of oxygen to crystallize the PZT film 4a.

Figure 3C:
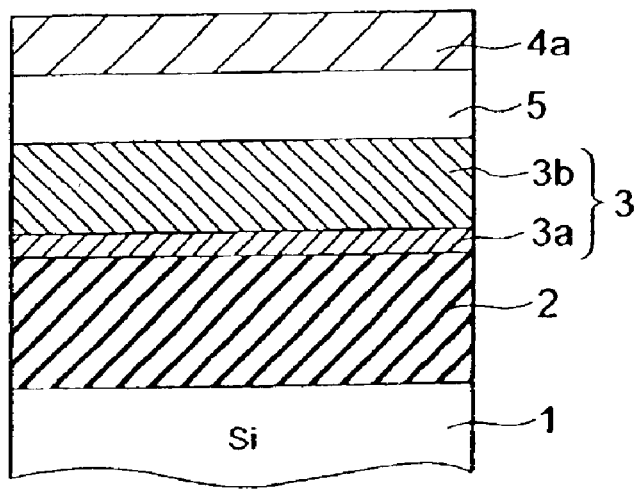

At this heat treatment step for crystallization, a diffusion reaction is caused between the bottom electrode 3 and the PZT film 4a to form a diffusion reaction layer 5 as shown in FIG. 3C. It has been revealed by the inventor's analysis that the diffusion reaction layer 5 is a Pb—Pt—(Ti—)O layer, and that the reason why the diffusion reaction layer 5 is formed is that the state of the PZT film 4a before the heat treatment is an amorphous state.

Figure 3D:
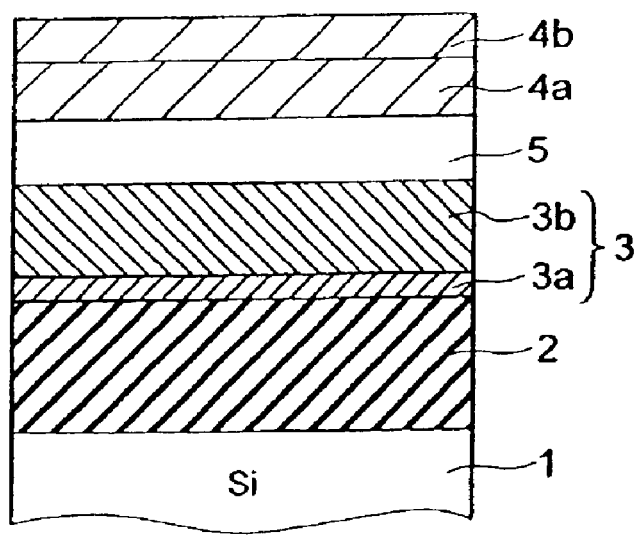

Thereafter, as shown in FIG. 3D, a second PZT film 4b having a thickness of about 10 nm is deposited on the crystallized first PZT film by the sol-gel method or the sputtering method at a low temperature. At this stage, the state of the PZT film 4b is an amorphous state.

Figure 3E:
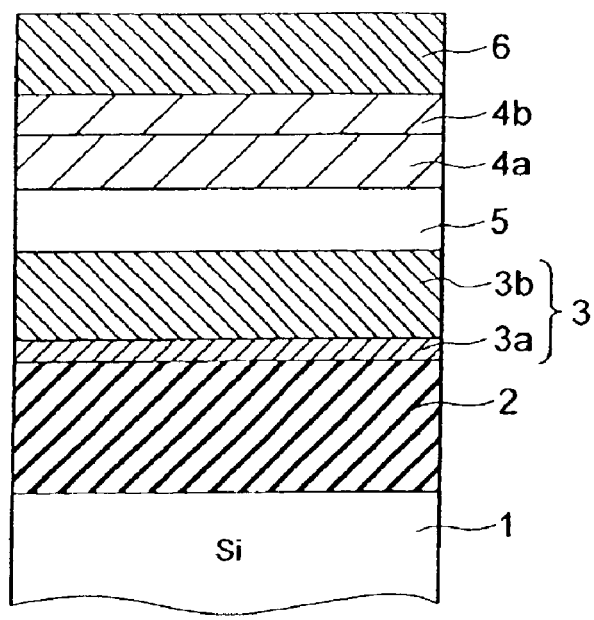

Then, as shown in FIG. 3E, a Pt film 6 having a thickness of 100 nm is deposited on the PZT film 4b by the sputtering method.

Figure 3F:
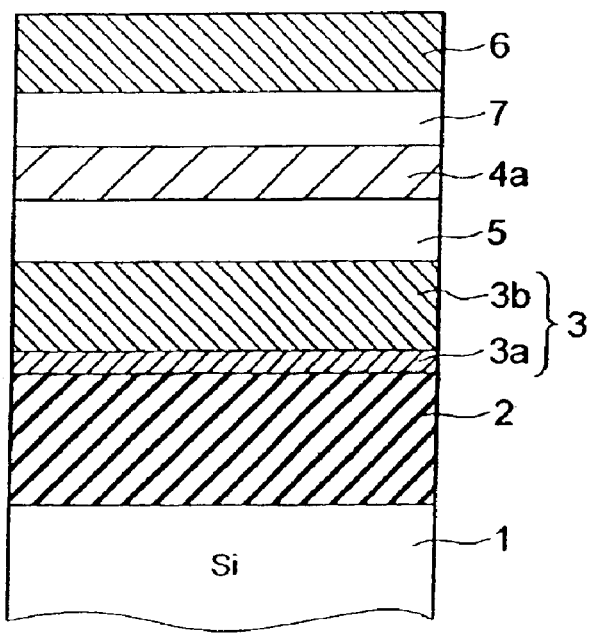

Thereafter, a heat treatment (RTA) is carried out at 750° C. in an atmosphere of oxygen to crystallize the PZT film 4b. At this heat treatment step for crystallization, a diffusion reaction is caused between the top electrode 6 and the PZT film 4b to form a diffusion reaction layer 7 as shown in FIG. 3F. This diffusion reaction layer 7 is also a Pb—Pt—(Ti—)O layer in which platinum is diffused.

The foregoing steps have been described with respect to only the ferroelectric capacitor. If the above described process is actually applied to, e.g., a ferroelectric memory having memory cells of the same one-transistor/one-capacitor structure as that of a DRAM, using a MOS transistor and a ferroelectric capacitor, it is as follows.

Figure 4A:
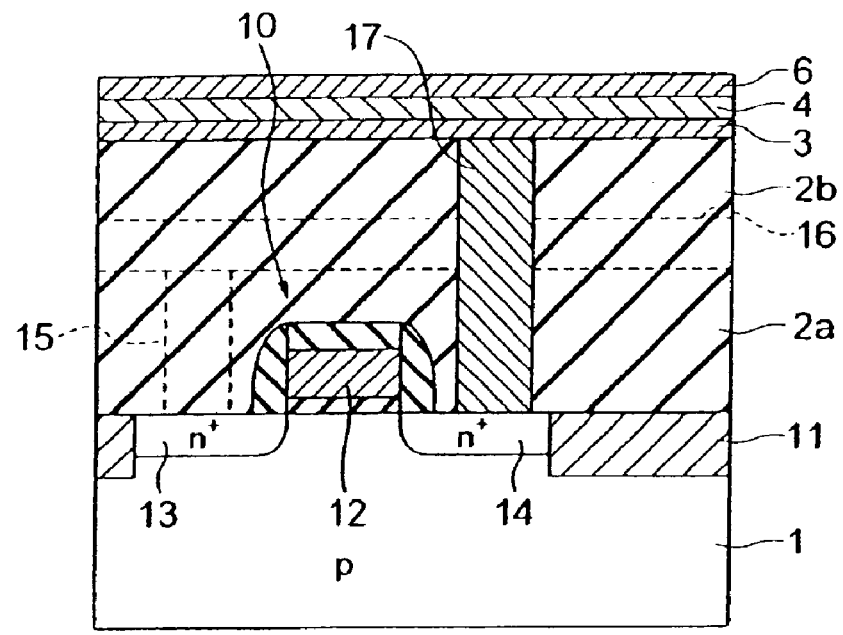
FIG. 4A is a sectional view showing an example of the preferred embodiment of a ferroelectric capacitor according to the present invention, which is applied to a ferroelectric memory.

As shown in FIG. 4A, an element isolating insulator film 11 is previously formed in the silicon substrate 1 by, e.g., the embedding method. Then, a MOS transistor 10 having a gate electrode 12 and source/drain diffusion layers 13, 14 is formed. The substrate, on which the MOS transistor 10 has been formed, is covered with a CVD silicon oxide film 2a serving as an interlayer insulator film. In the silicon oxide film 2a, a contact conductor 15 connected to one diffusion layer 13 is embedded. Then, a bit line 16 connected to the contact conductor 15 is formed on the silicon oxide film 2a. The reason why the contact conductor 15 and the bit line 16 are shown by broken lines is that the contact conductor 15 and the bit line 16 are formed opposite to a contact conductor 17, which is connected to the other diffusion layer 14 of the MOS transistor 10, in a direction perpendicular to the plane of the drawing.

Figure 4B:
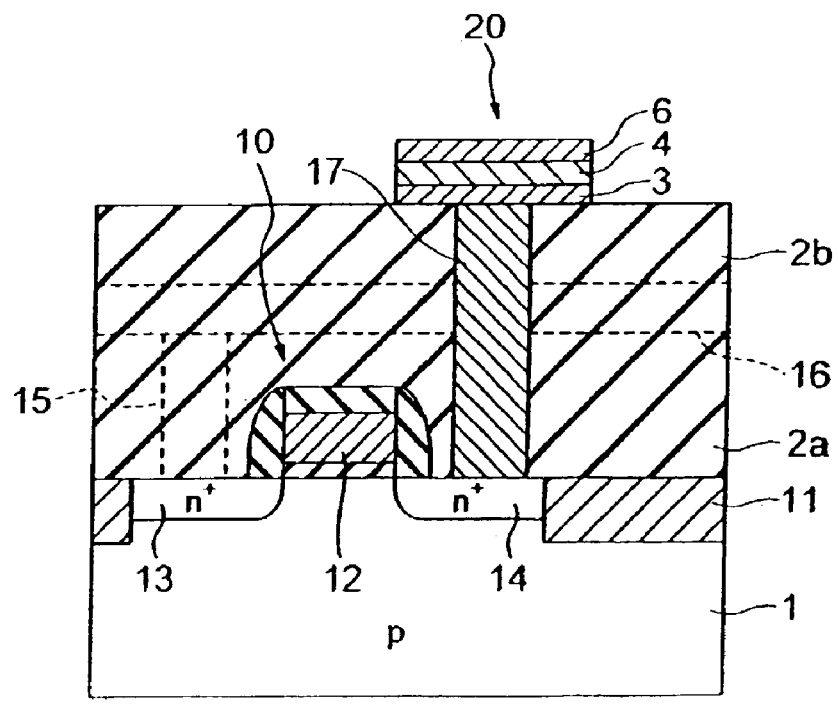
FIG. 4B is a sectional view showing a step of patterning the capacitor in the example of FIG. 4A.

On the substrate, on which the bit line 16 has been formed, a silicon oxide film 2b serving as an interlayer insulator film is deposited. Then, the contact conductor 17 connected to the other diffusion layer 14 of the MOS transistor 10 is embedded so as to pass through the silicon oxide films 2a, 2b. Then, the bottom electrode 3, the PZT film 4 and the top electrode 6 are stacked on the silicon oxide film 2b by the steps shown in FIGS. 3A through 3F. Thereafter, as shown in FIG. 4B, the stacked film is patterned for each memory cell to form a ferroelectric capacitor 20.

Figure 4C:
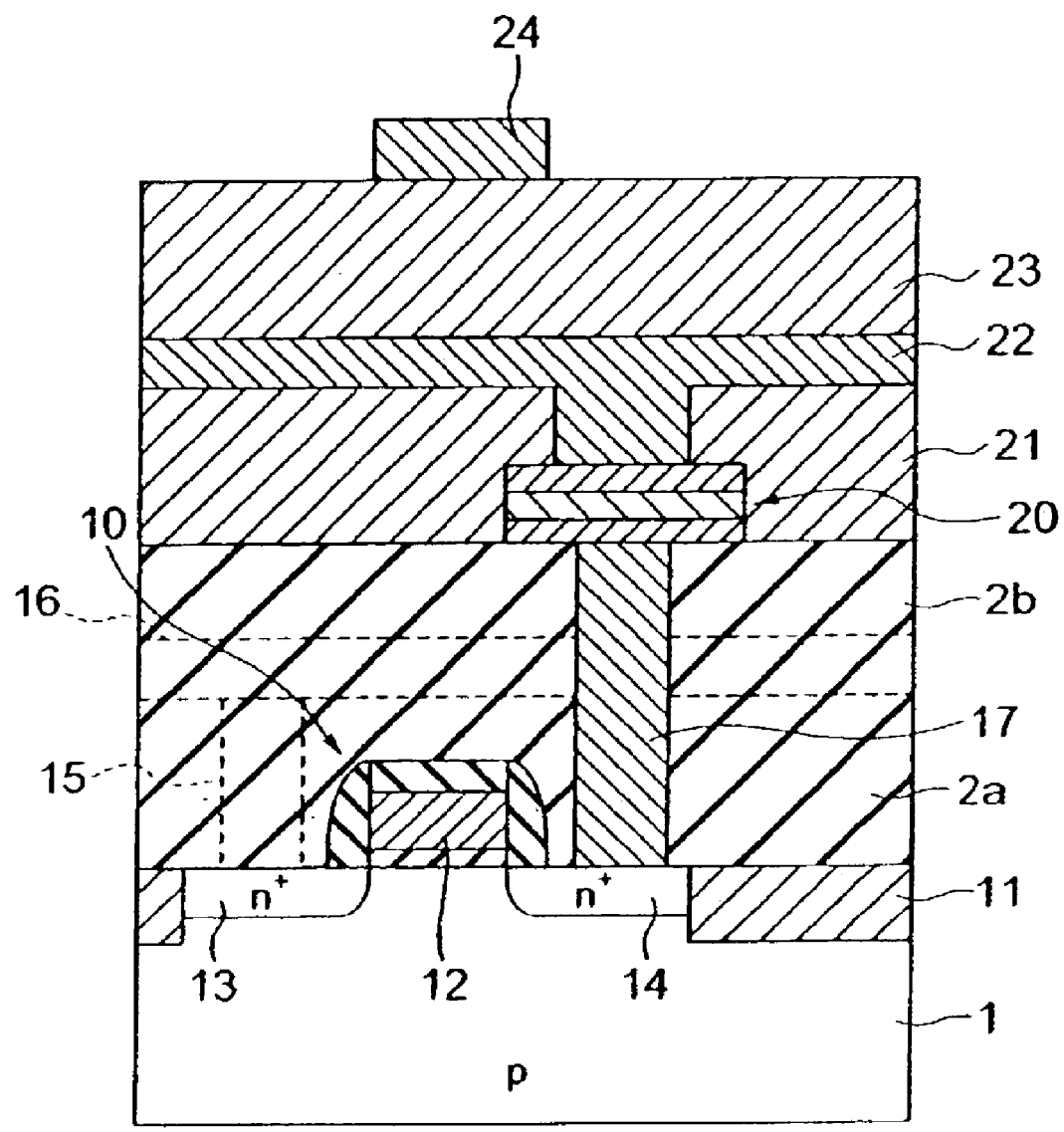
FIG. 4C is a sectional view showing the structure of the capacitor in the example of FIG. 4A after the capacitor is integrated.

Thereafter, as shown in FIG. 4C, a CVD silicon oxide film 21 serving as an interlayer insulator film is deposited to form a contact hole to the capacitor 20 to form a plate electrode 22. Moreover, a CVD silicon oxide film 23 serving as an interlayer insulator film is deposited thereon to form an interconnection layer 24. The interconnection layer 24 is protected by a passivation film (not shown).

The internal composition and characteristics of a ferroelectric capacitor in this preferred embodiment will be described in detail below.

Figure 5:
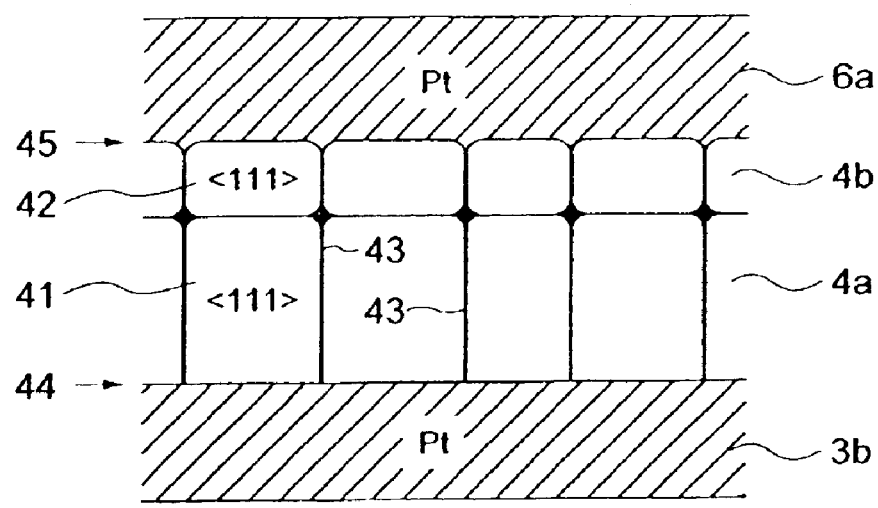
FIG. 5 is a schematic diagram showing the crystal structure of the preferred embodiment of a ferroelectric capacitor according to the present invention.

FIG. 5 schematically shows the crystal structure of a ferroelectric capacitor in this preferred embodiment. The first PZT film 4a is a polycrystalline of an aggregation of crystal grains 41 which have crystal-grown in directions of axis <111>. Each of the crystal grains 41 is defined by grain boundaries 43 perpendicular to the plane of the bottom electrode. It has been confirmed by analysis using a secondary ion mass spectrometer (SIMS) that the layer 44 between the PZT film 4a and the bottom Pt electrode 3b is substantially flat and that a Pt—Pb—(Ti—)O reaction layer is formed in the layer 44. This point will be described later.

The second PZT film 4b becomes crystal grains 42 which have grown on the crystallized first PZT film 4a so as to be substantially matched with the crystal grains 41 and which have a smaller mean particle diameter than that of the crystal grains 41. Most of excessive Pb at the heat treatment step of crystallizing the first PZT film 4a is collected on the surface of the first PZT film 4a. Therefore, if the top Pt electrode 6a is formed directly on the first PZT film 4a, most of Pb remains in the boundary of the top Pt electrode 6a. However, in this preferred embodiment, after the very thin second PZT film 4b is stacked on the first PZT film 4a to deposit the top Pt electrode 6a in an amorphous state, the second PZT film 4b is crystallized. As a result, excessive Pb does not remain in the layer between the top Pt electrode 6a and the second PZT film 4b.

Figure 6:
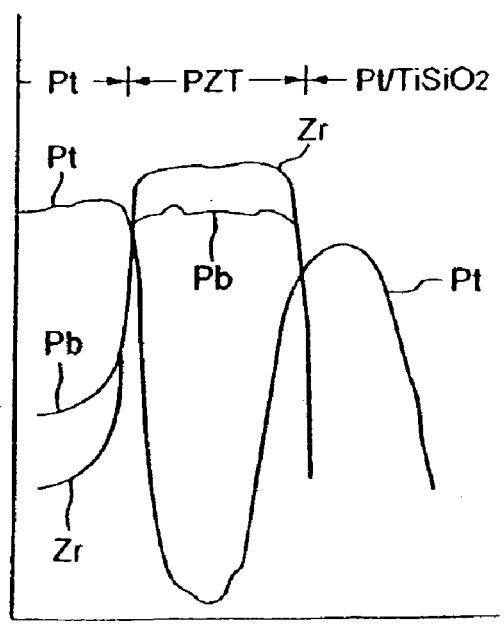
FIG. 6 is a graph showing the results of the SIMS analysis of the preferred embodiment of a ferroelectric capacitor according to the present invention.
Figure 7:
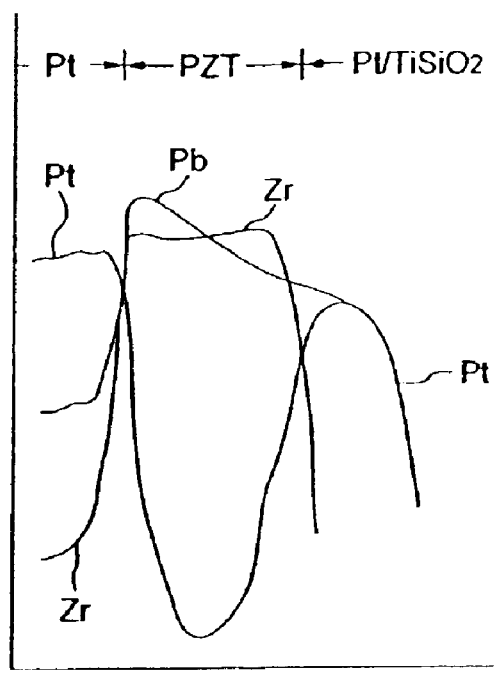
FIG. 7 is a graph showing the results of the SIMS analysis of a conventional ferroelectric capacitor.
Figure 8:
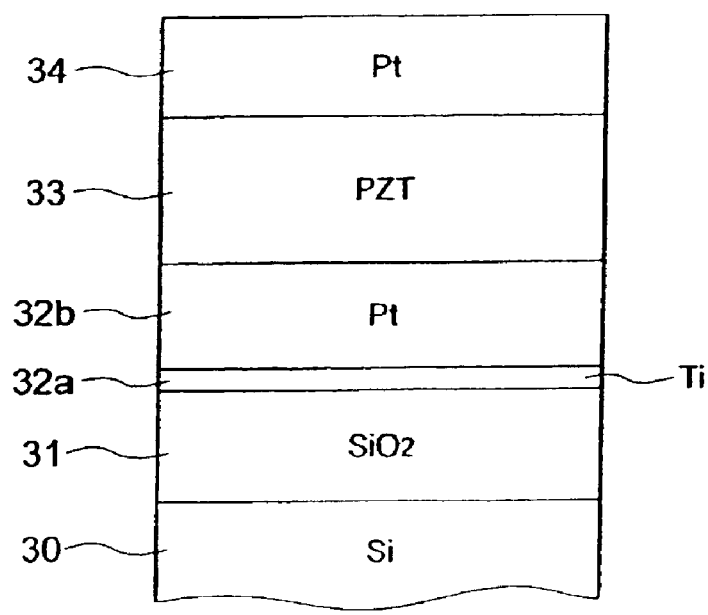
FIG. 8 is a schematic diagram showing the structure of the conventional ferroelectric capacitor.

FIGS. 6 and 7 show the results of the SIMS analysis of a ferroelectric capacitor in this preferred embodiment and a conventional ferroelectric capacitor. As shown in FIG. 8, the conventional ferroelectric capacitor has a single PZT film 33 as a ferroelectric film. That Is, this ferroelectric capacitor is produced by forming a bottom electrode 32 of an adhesion film 32a and Pt film 32b on a silicon substrate 30 covered with a silicon oxide film 31, forming a PZT film 33 thereon, and then, crystallizing the PZT film 33 to form a top Pt electrode 34.

As can be clearly seen from FIG. 7, in the conventional ferroelectric capacitor, the distribution of Pb is inclined in the PZT film in a thickness direction thereof, and the concentration of Pb in the layer between the top electrode and the PZT film is higher than that in the layer between the bottom electrode and the PZT film The reason for this is that the PZT film is formed on the Pb rich condition so that excessive Pb at the heat treatment step for crystallization is collected on the surface portion of the PZT film in the form of Pb—O.

On the other hand, in the structure of this preferred embodiment, as shown in FIG. 6, although a small peak of concentration of Pb exists in the vicinity of the top Pt electrode in the PZT film (in the vicinity of the layer between the first PZT film and the second PZT film), the concentration of Pb in the PZT film is substantially even as a whole, so that at least the concentrations of Pb in the layers between the top and bottom electrodes and the PZT films are substantially equal to each other. The reason for this is that the mean particle diameters of the crystal grains in the first and second PZT films are different from each other, i.e., a grain boundary substantially parallel to the plane of the bottom electrode is formed in the whole layer between the first PZT film and the second PZT film, and excessive Pb aggregates in the grain boundary, so that the distribution of Pb in the whole PZT film is substantially even.

Furthermore, even if the concentration of Pb is slightly high in the layer between the first and second PZT films, the catalysis of Pt is difficult to have an influence on the layer, so that a great degradation in characteristics is not caused by the reduction reaction of Pb—O.

Figure 9:
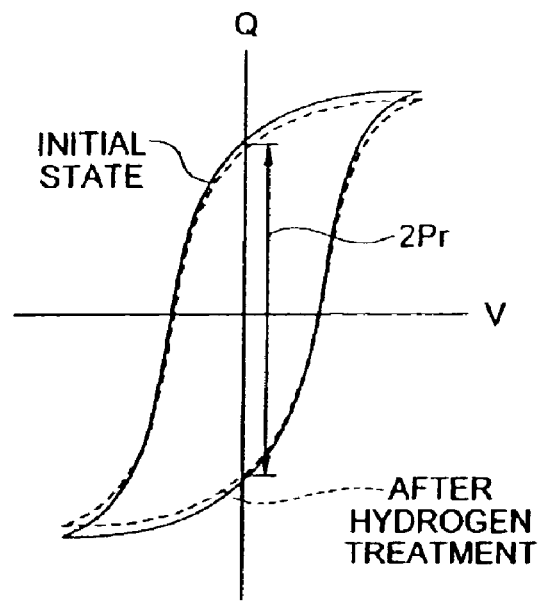
FIG. 9 is a graph showing the P-V characteristic of the preferred embodiment of a ferroelectric capacitor according to the present invention.
Figure 10:
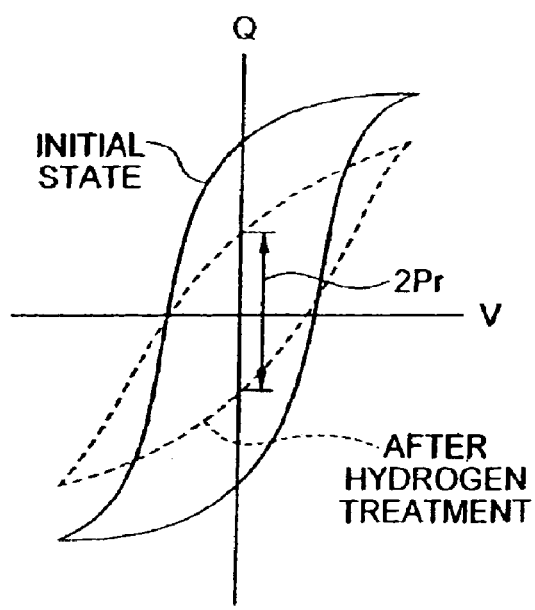
FIG. 10 is a graph showing the P-V characteristic of the conventional ferroelectric capacitor.

The characteristics of the ferroelectric capacitor in this preferred embodiment and the conventional ferroelectric capacitor of FIG. 8 are shown in FIGS. 9 and 10, respectively. Both show initial states (solid lines) and states after a heat treatment (hydrogen treatment) in an atmosphere of $H_2$, with respect to hysteresis characteristics when a voltage of ±5 V is applied In the conventional structure, the spontaneous polarization of hysteresis after hydrogen treatment was $2Pr=9 \mu C/cm^2$. On the other hand, in the structure of this preferred embodiment, the spontaneous polarization of hysteresis was $2Pr=30 \mu C/cm^2$.

It is considered that the reasons why the degradation of the capacitor due to hydrogen is small in this preferred embodiment are as follows One of the reasons is the fact that excessive Pb does not exist in the layer between the top Pb electrode and the PZT film. That is, even if hydrogen penetrates into this layer, oxygen vacancy based on the reduction reaction due to the catalysis of the Pt electrode is not very much. The other reason is the fact that the diffusion reaction layer of Pb—Pt—Ti—O is formed in the layer between the top Pt electrode and the PZT film to inhibit the catalysis of Pt.

In order to obtain the above described advantages in this preferred embodiment, the top Pt electrode 6a must be formed when the state of the second PZT film 4b is in amorphous state. On this condition, the Pb—Pt—Ti—O reaction layer 7 is formed. In addition, the effective thickness of the second PZT film 4b is preferably 150 nm or less, more preferably about 100 nm or less. It is enough that the minimum thickness of the second PZT film 4b is 1 nm.

Figure 11:
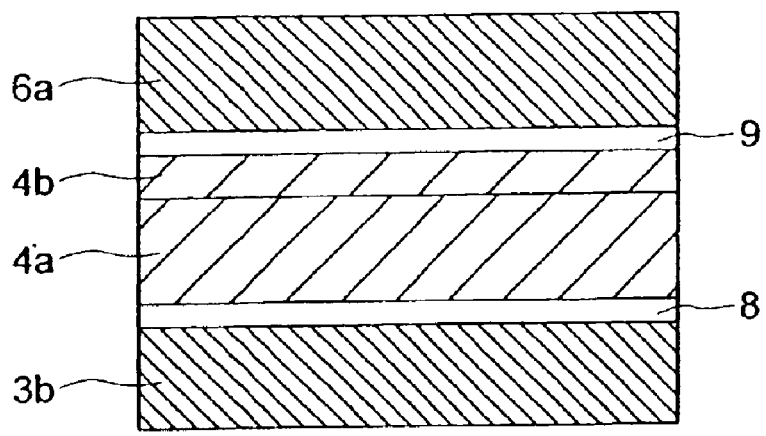
FIG. 11 is a sectional view showing the structure of a second preferred embodiment of a ferroelectric capacitor according to the present invention.

FIG. 11 shows the structure of a principal part of a second preferred embodiment of a ferroelectric capacitor according to the present invention. In this preferred embodiment unlike the preceding preferred embodiment, very thin Ti films 8 and 9 are formed in the layer between the Pt films 3b, 6a of the top and bottom electrodes and the PZT films 4a, 4b, respectively. These Ti films 8 and 9 serve as nuclei for the crystal growth of the PZT films 4a and 4b, and promote the formation of the diffusion reaction layer of Pb—P—(Ti—) O. The thickness of the Ti films 8 and 9 may be in the range of about 0.5 nm to about 10 nm. Other conditions are the same as those in the preceding preferred embodiment.

According to this preferred embodiment, it is possible to obtain a better crystalline PZT film, and to sufficiently form diffusion reaction layers in the layers between the PZT films and the Pt films of the top and bottom electrodes to inhibit the aggregation of Pb—O.

As described above, according to the present invention, the structure of the capacitor and the method for manufacturing the same are improved so that the fixed charge due to oxygen vacancy is not produced even if hydrogen penetrates into the layer between the top Pt electrode and the PZT film. On the other hand, after the inventors analyzed non-defective and defective samples of the conventional ferroelectric capacitors shown in FIG. 8, it was revealed that if the concentration of hydrogen was about $1 \times 10^{20}/cm^3$ in the layer between the top Pt electrode and the PZT film, then there was a remarkable decrease of spontaneous polarization.

Figure 12:
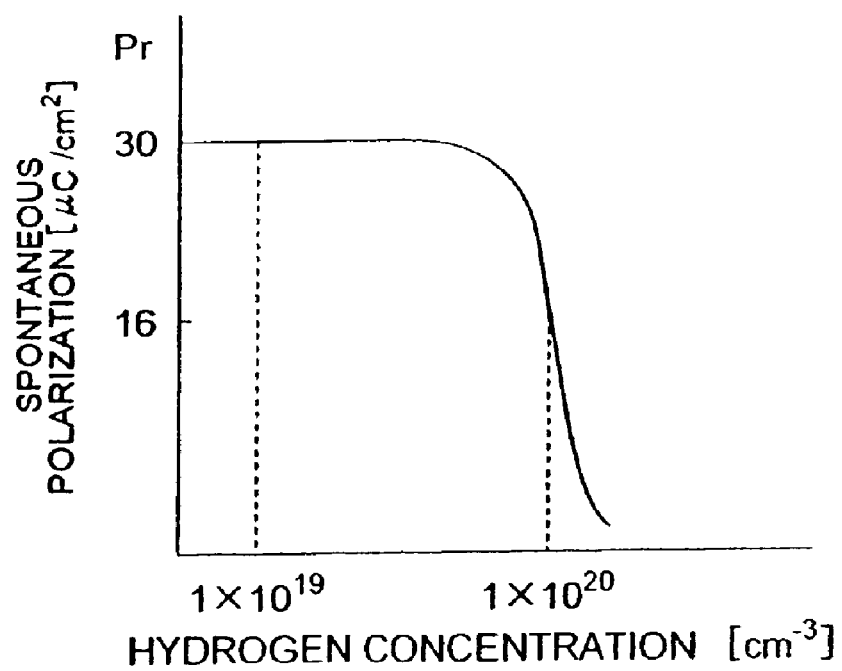
FIG. 12 is a graph showing the correlation between hydrogen concentration and spontaneous polarization of the conventional ferroelectric capacitor.

FIG. 12 shows the correlation between the concentration of hydrogen in the layer between the top Pt electrode and the PZT film, and the spontaneous polarization Pr of the capacitor, which was obtained by the above-described analysis. From these data, it is found that the spontaneous polarization rapidly decreases if the concentration of hydrogen exceeds a certain level.

In the case of the ferroelectric memory produced by the LSI process described in FIGS. 4A through 4C, the concentration of hydrogen in the ferroelectric capacitor is difficult to be $1 \times 10^{19}/cm^3$. Because it is not possible to prevent hydrogen from penetrating from the interlayer insulator films 21, 23 on the capacitor 20 shown in FIG. 4C and from a molding material (not shown) formed thereon. Therefore, even in the case of the conventional ferroelectric capacitor, if the hydrogen concentration of the capacitor is small in the range of from $1 \times 10^{19}/cm^3$ to $1 \times 10^{20} cm^3$, preferably in the range of from $2 \times 10^{19}/cm^3$ to $1 \times 10^{20}/cm^{-3}$, it is possible to obtain good characteristics which do not cause the decrease of spontaneous polarization.

In order to confine the hydrogen concentration of the capacitor within the above described range, it is enough that the interlayer insulator films 21 and 22 on the capacitor 20 shown in FIG. 4C has a hydrogen concentration of $1 \times 10^{20}/cm^3$ or less. Moreover, the interlayer insulator films 21 and 23 preferably have a hydrogen diffusion coefficient of $1 \times 10^{-7} cm^2$ or less. In order to decrease the hydrogen diffusion coefficient of the interlayer insulator film, there is considered a method for adding N (nitrogen) into the silicon oxide film. From this point of view, a material having an evaporated hydrogen amount of 50 ppb or less is preferably selected as the molding material.

Of course, it is effective to set the above described hydrogen concentration range even in the case of the structure of the capacitor in the above described preferred embodiment.

Figure 13A:
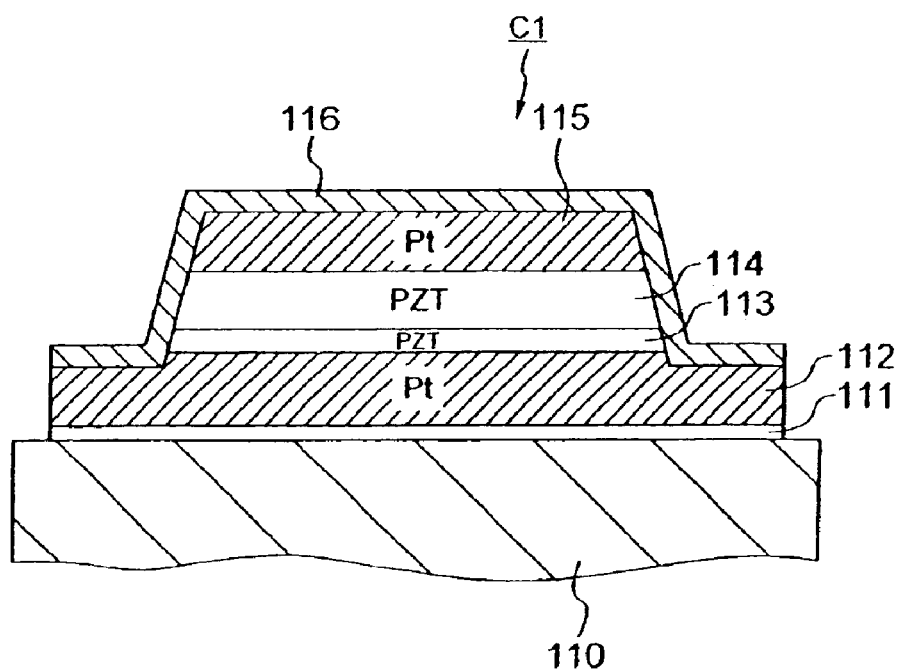
FIG. 13A is a sectional view showing the structure of the third preferred embodiment of a ferroelectric capacitor according to the present invention.

FIG. 13A shows the structure of a third preferred embodiment of a ferroelectric capacitor C1 according to the present invention. A substrate 110 is a silicon substrate covered with an insulator film of a silicon oxide film or the like. A Pt electrode 112 serving as a bottom electrode is formed on the substrate 110 via an adhesion film 111. On the Pt electrode 112, a first PZT film 113 and a second PZT film 114 are stacked. On the second PZT film 114, a Pt electrode 115 is formed as a top electrode.

In this preferred embodiment, the ferroelectric capacitor C1 is patterned as shown in the figure, and covered with a protective film 116 against a reducing gas. In particular, the protective film 116 covers the sides, at which the layers between the PZT films 113, 114 and the Pt electrodes 112, 115 terminate, to prevent the reducing gas from penetrating into these layers.

Figure 13B:
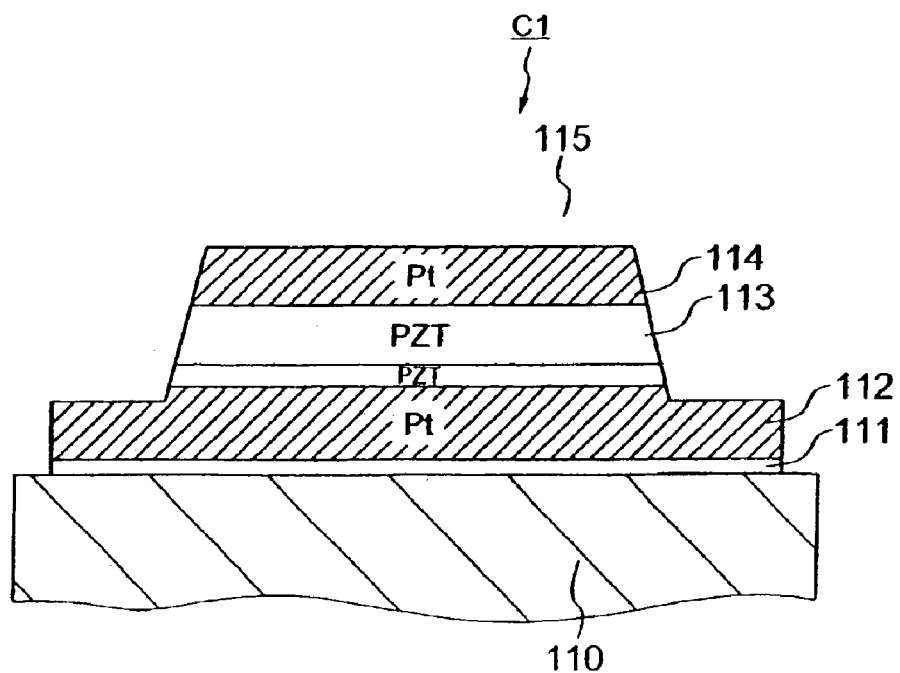
FIG. 13B is a sectional view showing a variation of the structure shown in FIG. 13A, which does not have a protective film.

It is to be noted that a structure without the protective film 116 as shown in FIG. 13B has also good electrical characteristics and if the protective film 116 is provided, the electrical characteristics will be further enhanced.

Figure 14A:
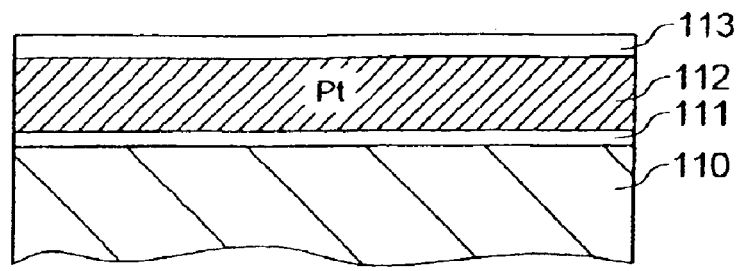
FIGS. 14A through 14C are sectional views showing a process for manufacturing the first preferred embodiment of a ferroelectric capacitor according to the present invention.
Figure 14B:
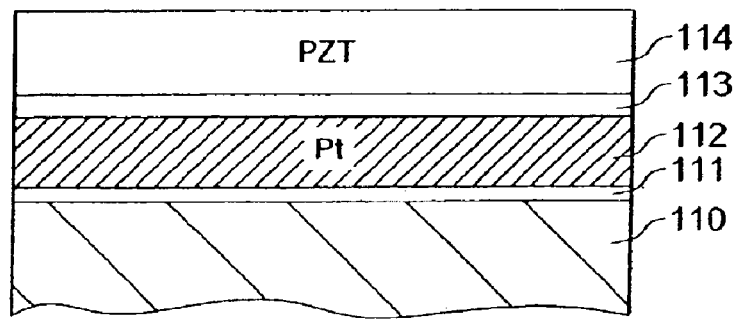
Figure 14C:
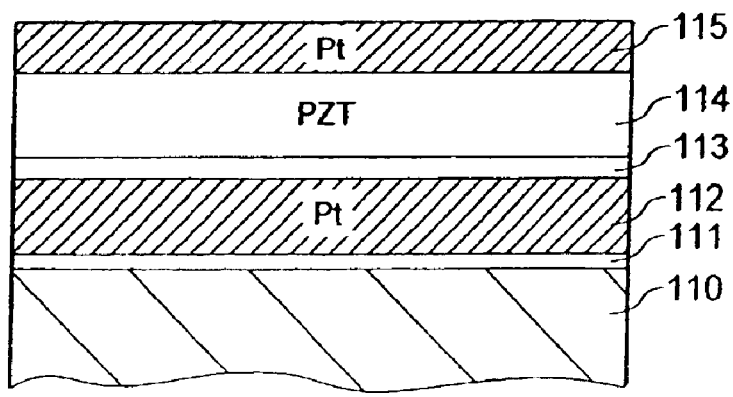

Referring to FIGS. 14A through 14C, a process for manufacturing a ferroelectric capacitor in this preferred embodiment will be described in detail below. As shown in FIG. 14A, an adhesion film 111 having a thickness of about 20 nm and a Pt electrode 112 having a thickness of about 200 nm are sequentially deposited on a substrate 110 by sputtering. Then, a first PZT film 113 is deposited on the Pt electrode 112 by the sol-gel method or sputtering method. The thickness of the first PZT film 113 is in the range of from 5 nm to 50 nm, preferably in the range of from 10 nm to 20 nm. AT this stage, the state of the first PZT film 113 is an amorphous state.

Thereafter, a heat treatment is carried out at a temperature of 650° C. to 750° C. in an atmosphere of oxygen to crystallize the first PZT film 113. At this crystallizing step, a diffusion reaction is caused between the Pt electrode 112 and the first PZT film 113 to crystallize the first PZT film 113 containing Pt. Thus, the first PZT film 113 becomes conductive.

Then, as shown in FIG. 14B, a second PZT film 114 is deposited on the first PZT film 113 by the sol-gel method or sputtering method. The thickness of the second PZT film 114 is in the range of from 50 nm to 300 nm. Then, a heat treatment is carried out at a temperature of 650° C. to 750° C. in an atmosphere of oxygen to crystallize the second PZT film 114. It has been confirmed that Pt is hardly diffused in the second PZT film 114 at this crystallizing step. The reason for this is that Pt, which has been incorporated into the first PZT film 113, has a small degree of freedom since the first PZT film 113 has been crystallized at this stage. In addition, the reason is that the diffusion of Pt from the bottom Pt electrode 112 into the second PZT film 114 is inhibited by the crystallized first PZT film 113.

Thereafter, as shown in FIG. 14C, a top Pt electrode 115 is deposited on the second PZT film 114 by sputtering. Although the subsequent steps are not shown, the stacked structure obtained by the above described steps is patterned to form a ferroelectric capacitor C1. Specifically, the patterning step is carried out as follows. First, the top Pt electrode 115, the second PZT film 114 and the first PZT film 113 are sequentially etched using a predetermined resist pattern. This etching is carried out by using the RIE method using $Ar/Cl_2/CF_4$ gas and by carrying out an over etching so as to slightly remove the surface of the bottom Pt electrode 112. Then, after the resist pattern is removed to form a protective film 116, a resist pattern for covering a broader range than the removed resist pattern is formed again to etch the protective film 116 and the bottom Pt electrode 112. The protective film 116 may be formed preferably at least one selected from the group consisting of $Al_xO_y$, $TiO_x$, $ZrO_x$, $MgTiO_x$, $Si_xN_y$, and $Ti_xSi_yN_z$, which are capable of blocking the penetration of hydrogen or the like.

Furthermore, with respect to the memory cells of the ferroelectric memory in this preferred embodiment, which have the one-transistor/one-capacitor structure comprising a ferroelectric capacitor C1 and a MS transistor, an example of the memory structure is shown in FIG. 15. As shown in this figure, a MOS transistor 103 is formed on a silicon substrate 101 in a region defined by an element isolating insulator film 102, and the top thereof is covered with an interlayer insulator film 104 of a silicon oxide film or the like.

A contact plug 107 to one of the diffusion layers of the MOS transistor 103 is embedded in the interlayer insulator film 104. A bit line 105 connected to the other diffusion layer of the MOS transistor 103 is also embedded in the interlayer insulator film 104. On the interlayer insulator film 104, the above described ferroelectric capacitor C1 is formed. In the shown example, a bottom Pt electrode 112 is connected to the MOS transistor 103 via the contact plug 107, and the connection node thereof serves as a memory node. Moreover, an interlayer insulator film 117 is formed on the capacitor C1. On the interlayer insulator film 117, a plate interconnection 118 connected to the top Pt electrode 115 of the capacitor C1 is formed.

Figure 16:
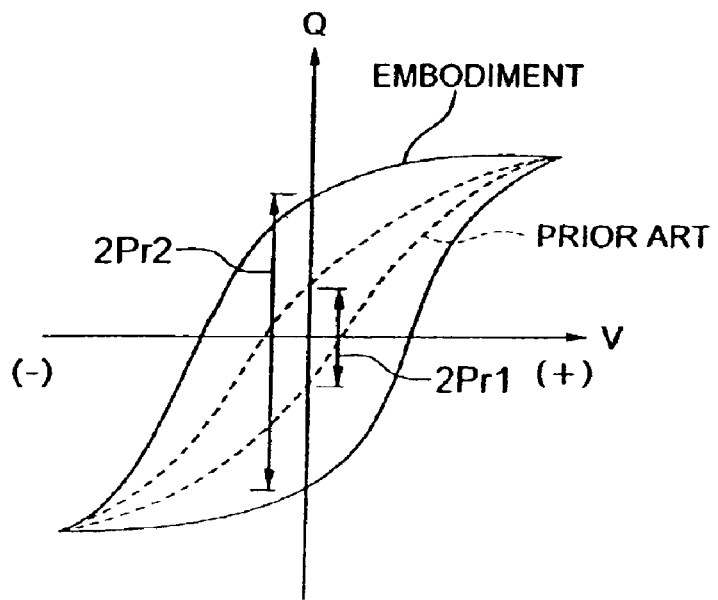
FIG. 16 is a graph showing the polarization characteristic of the first preferred embodiment of a ferroelectric capacitor according to the present invention, in comparison with that of the conventional ferroelectric capacitor.

FIG. 16 shows the polarization of the ferroelectric capacitor C1 in this preferred embodiment, in comparison with the conventional ferroelectric capacitor. This comparison is conducted for FRAM products for which the hydrogen treatment has been performed.

The conventional ferroelectric capacitor is produced by forming a single PZT film on a bottom Pt electrode, crystallizing the PZT film by a heat treatment, and then, forming a top Pt electrode thereon. The spontaneous polarization in the conventional ferroelectric capacitor was about 2Pr1=20 $\mu C/cm^2$, whereas the spontaneous polarization in this preferred embodiment was about 2Pr2=30 $\mu C/cm^2$.

The reasons why the above described great spontaneous polarization can be obtained in this preferred embodiment are that the PZT film has a two-layer structure, and the PZT film 113 is crystallized before the second PZT film 114 is formed, so that Pt is diffused into the first PZT film 113 from the bottom Pt electrode 112, and that Pt is not diffused in the second PZT film 114. This has been revealed by the results of the SIMS analysis.

Figure 17:
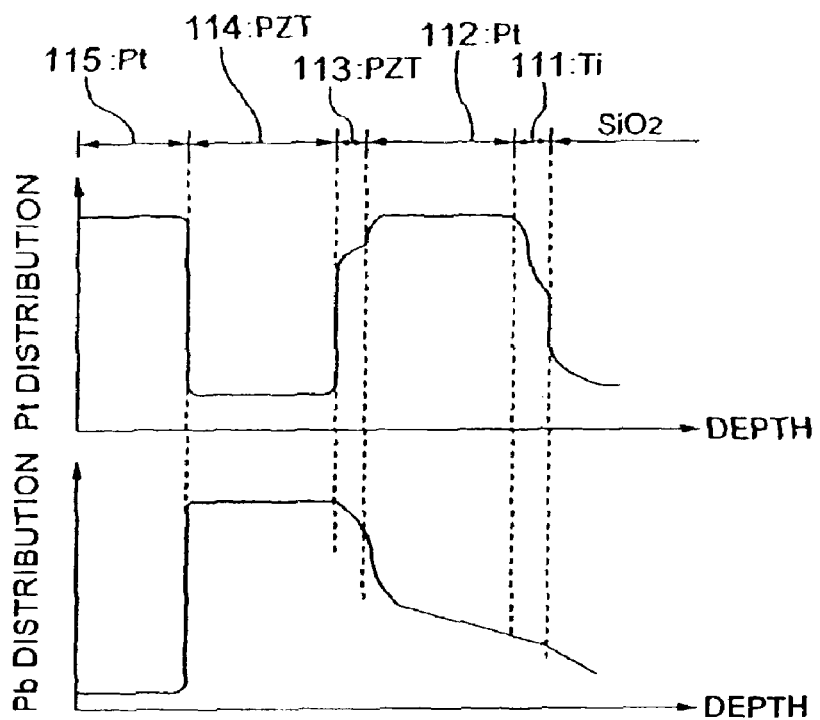
FIG. 17 is a graph showing the results of the SIMS analysis of the first preferred embodiment of a ferroelectric capacitor according to the present invention.
Figure 18:
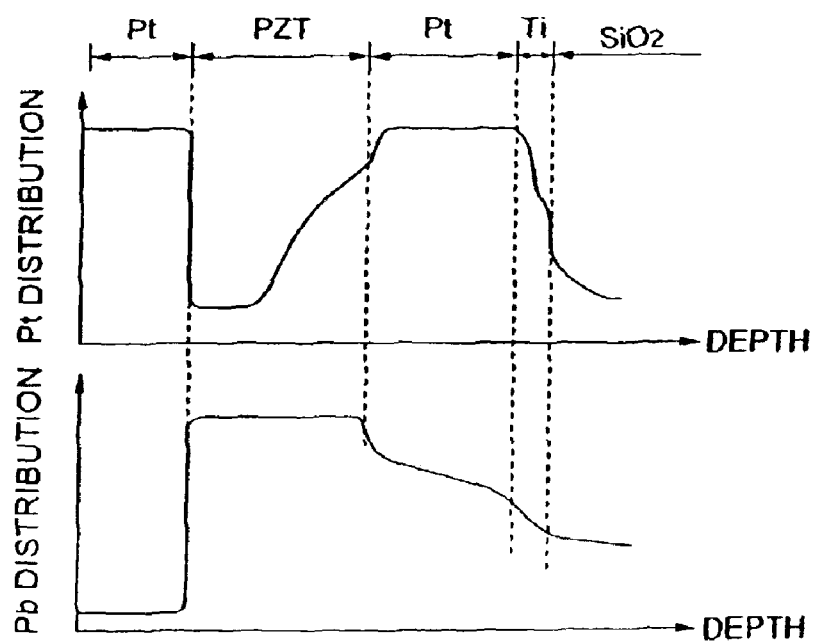
FIG. 18 is a graph showing the results of the SIMS analysis of the conventional ferroelectric capacitor.

FIGS. 17 and 18 show the distributions of Pt and Pb obtained by the SIMS analysis, with respect to the ferroelectric capacitor C1 in this preferred embodiment and the conventional ferroelectric capacitor. In the case of the conventional ferroelectric capacitor, it can be seen from FIG. 18 that a deep Pt diffusion layer extending from the bottom Pt electrode exists in the PZT film. As described above, this Pt diffusion layer is conductive, so that it is not possible to obtain a good spontaneous polarization. On the other hand, in the case of this preferred embodiment, it can be seen from FIG. 17 that Pt is hardly diffused in the second PZT film 114 although Pt is diffused in the first PZT film 113.

Figure 19A:
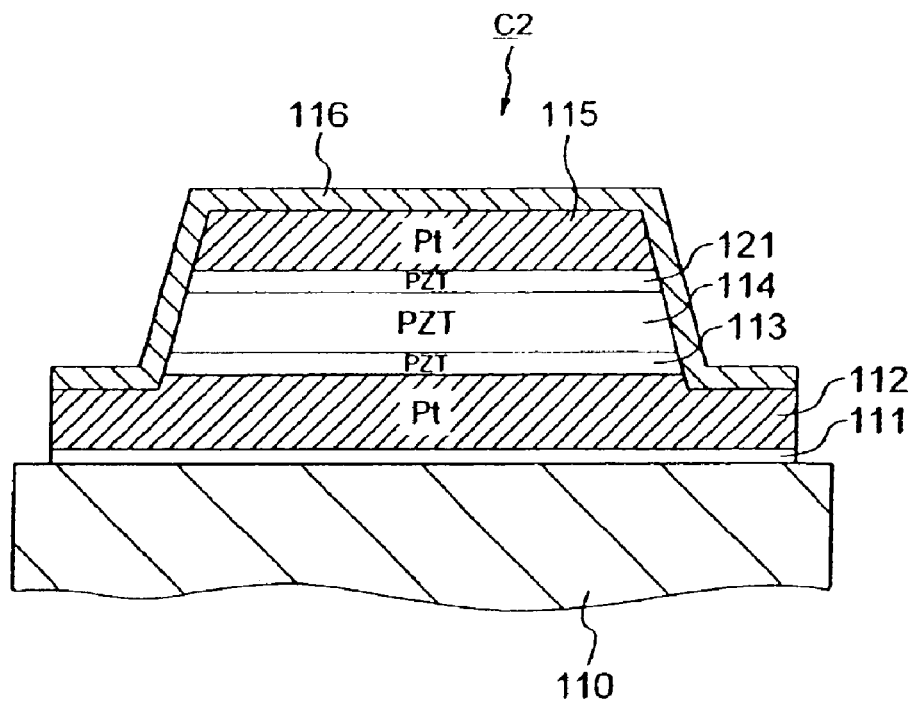
FIG. 19A is a sectional view showing the structure of the fourth preferred embodiment of a ferroelectric capacitor according to the present invention.

FIG. 19A shows the structure of the fourth preferred embodiment of a ferroelectric capacitor C2 according to the present invention, which is applied to a ferroelectric memory, so as to correspond to FIG. 13A. A substrate 110 is a silicon substrate covered with an insulator film of a silicon oxide film or the like. A Pt electrode 112 serving as a bottom electrode is formed on the substrate 110 via an adhesion film 111. The adhesion film 111 is provided for improving the adhesion of the Pt electrode 112 to the silicon oxide film or the like. On the Pt electrode 112, a first PZT film 113, a second PZT film 114 and a third PZT film 121 are stacked. On the third PZT film 121, a Pt electrode 115 is formed as a top electrode.

In this preferred embodiment, the ferroelectric capacitor C2 is patterned as shown in the figure, and covered with a protective film 116 against a reducing gas. In particular, the protective film 116 covers the sides, to which the layers between the PZT films 113, 114 and the Pt electrodes 112, 115 are exposed, to prevent the reducing gas from penetrating into these layers.

Figure 19B:
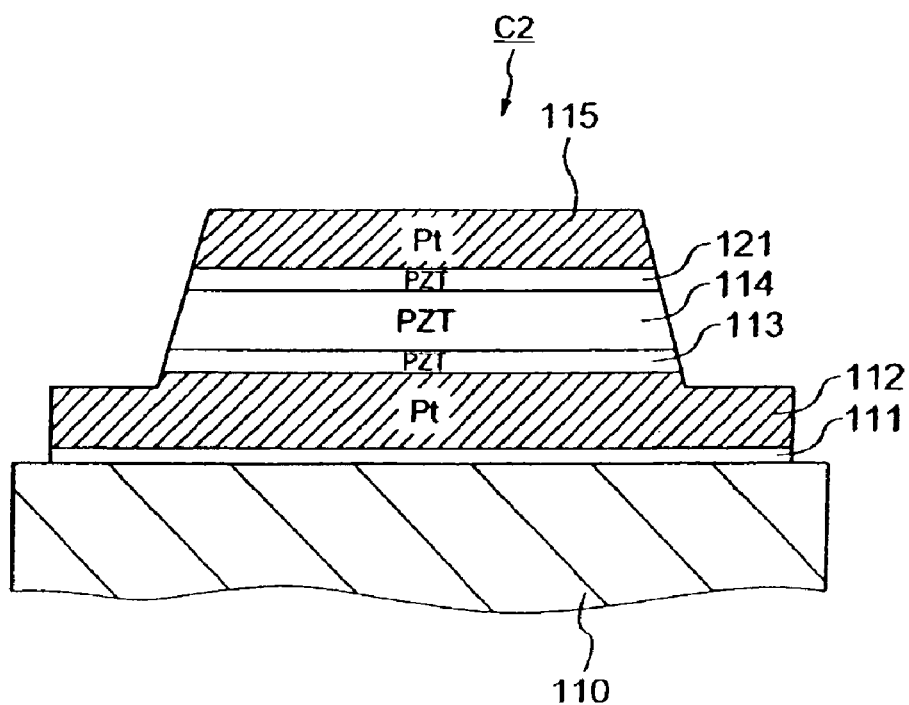
FIG. 19B is a sectional view showing a variation of the structure shown in FIG. 19A, which does not have a protective film.

It is to be noted that as shown in FIG. 19B, a structure without the protective film 116 has also good electrical characteristics and if the protective film 116 is provided, the electrical characteristics will be further enhanced.

Figure 20A:
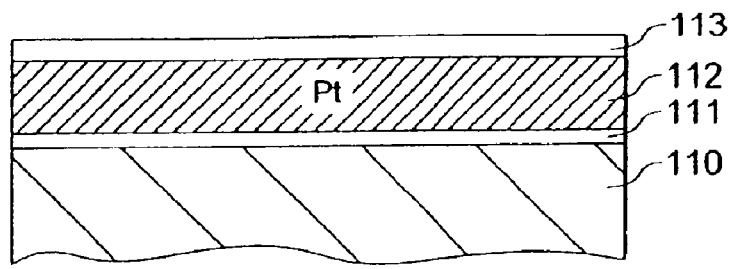
FIGS. 20A through 20C are sectional views showing a process for manufacturing the fourth preferred embodiment of a ferroelectric capacitor according to the present invention.
Figure 20B:
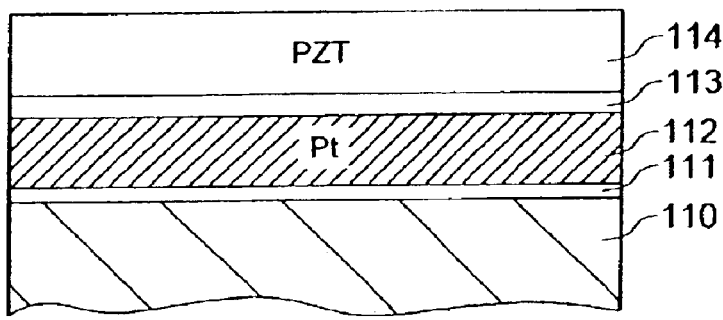
Figure 20C:
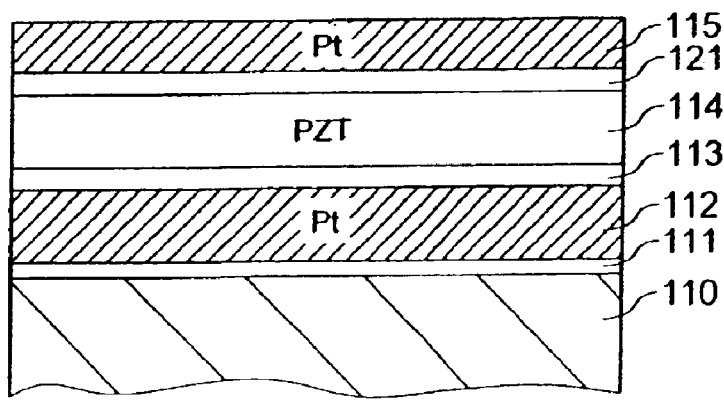

FIGS. 20A through 20C show a process for manufacturing a ferroelectric capacitor C2 in this preferred embodiment so as to correspond to FIGS. 14A through 14C. As shown in FIG. 20A, an adhesion film 111 having a thickness of about 20 nm and a Pt electrode 112 having a thickness of about 200 nm are sequentially deposited on a substrate 110 by sputtering. In this state, a heat treatment is preferably carried out at about 500° C. in an atmosphere of oxygen. Then, a first PZT film 113 is deposited on the Pt electrode 112 by the sol-gel method or sputtering method. The thickness of the first PZT film 113 is in the range of from 5 nm to 50 nm, preferably in the range of from 10 nm to 20 nm. At this stage, the state of the first PZT film 113 is an amorphous state.

Thereafter, a heat treatment is carried out at a temperature of 650° C. to 750° C. in an atmosphere of oxygen to crystallize the first PZT film 113. At this crystallizing step, a diffusion reaction is caused between the Pt electrode 112 and the first PZT film 113 to crystallize the first PZT film 113 containing Pt.

Then, as shown in FIG. 20B, a second PZT film 114 is deposited on the first PZT film 113 by the sol-gel method or sputtering method. The thickness of the second PZT film 114 is in the range of from 300 nm to 2000 nm. Then, a heat treatment is carried out at a temperature of 650° C. to 750° C. in an atmosphere of oxygen to crystallize the second PZT film 114. At this crystallizing step, Pt is hardly diffused in the second PZT film 114.

Thereafter, as shown in FIG. 20C, a third PZT film 121 is deposited on the second PZT film 114 by sol-gel method or sputtering method so as to have a thickness of 5 nm to 50 nm, preferably 10 nm to 20 nm. Subsequently, a top Pt electrode 115 is deposited thereon. Thereafter, a heat treatment is carried out at a temperature of 650° C. to 750° C. in an atmosphere of oxygen to crystallize the third PZT film 121. At this crystallizing step, Pt is diffused in the third PZT film 121 from the top Pt electrode 115, so that the third PZT film 121 becomes conductive.

Then, the stacked structure thus obtained is patterned to form a protective film 116 similar to the above described first preferred embodiment.

In this fourth preferred embodiment unlike the third preferred embodiment, the PZT film has a three-layer structure, and the third PZT film 121 is crystallized after the top Pt electrode 115 is deposited. By this crystallization after forming the top Pt electrode 115, a low resistance contact is obtained between the third PZT film 121 and the top Pt electrode 115. Although Pt is diffused in the third PZT film 121 as described above, the second PZT film 114 may be previously crystallized so that Pt is hardly diffused therein.

Figure 21:
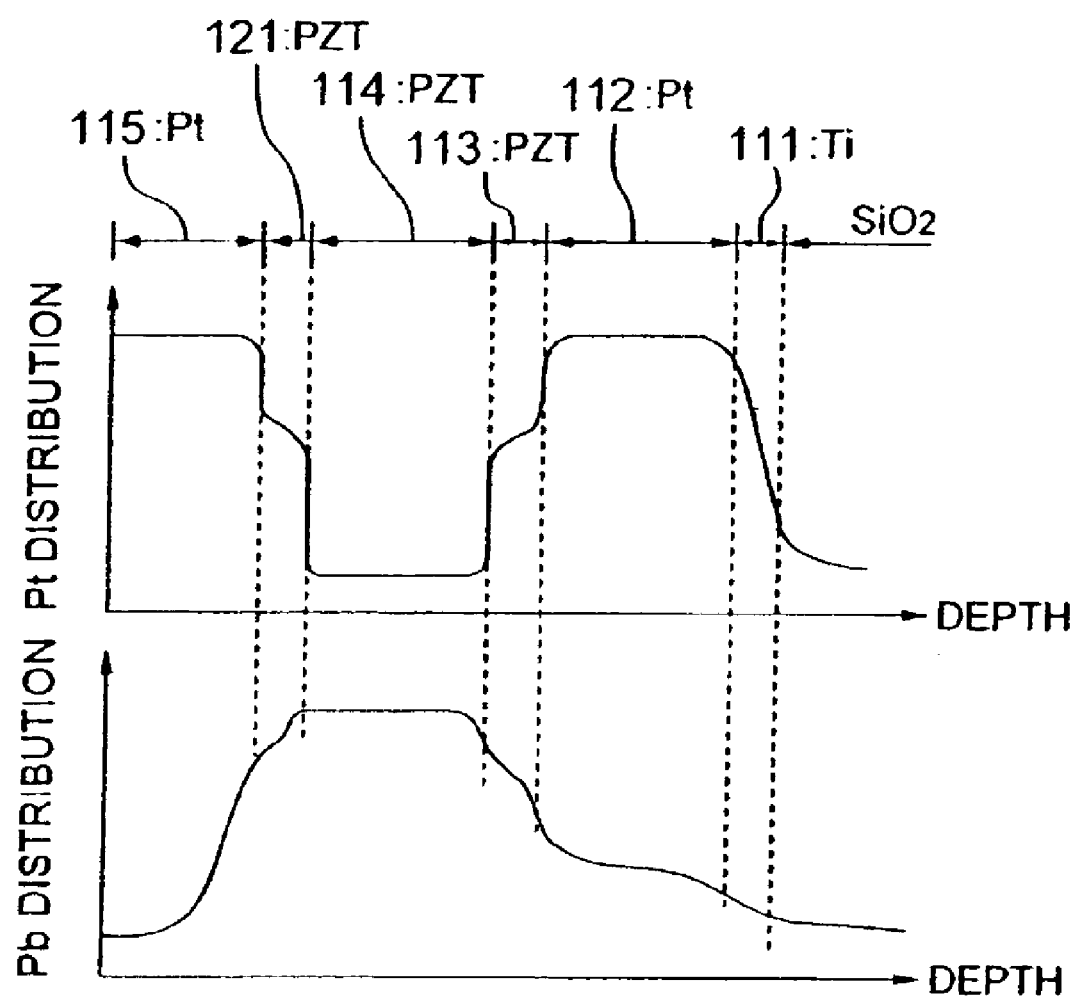
FIG. 21 is a graph showing the results of the SIMS analysis of the second preferred embodiment of a ferroelectric capacitor according to the present invention.

FIG. 21 shows the distributions of Pt and Pb obtained by the SIMS analysis, with respect to the ferroelectric capacitor C2 in this preferred embodiment. As shown in this figure, Pt is hardly diffused in the second PZT film 114 although most Pt is diffused in the first and third PZT film 113 and 121.

Therefore, also in the fourth preferred embodiment, the second PZT film 114 serves as a substantial capacitor dielectric film for determining the spontaneous polarization, and has a small leak and an excellent spontaneous polarization. In addition, the thickness of the ferroelectric capacitor can be decreased by selecting the thickness of the second PZT film 114. Moreover, in the second preferred embodiment, the first PZT film 113 serves as a metallic layer for inhibiting the hydrogen degradation of the second PZT film 114 due to the catalysis of the bottom Pt electrode 112. Thus, it is possible to realize a stable spontaneous polarization which has smaller degradation.

The present invention may be applied to a DRAM or the like using a high-dielectric capacitor, not only to the ferroelectric capacitor. In this case, for example, BSTO, i.e., (Ba, Sr)TiO$_3$, having a relative dielectric constant of 50 or more is used as a metal oxide dielectric of a high-dielectric capacitor. The preferred embodiments of the present invention applied to a high-dielectric capacitor will be described below.

Figure 22:
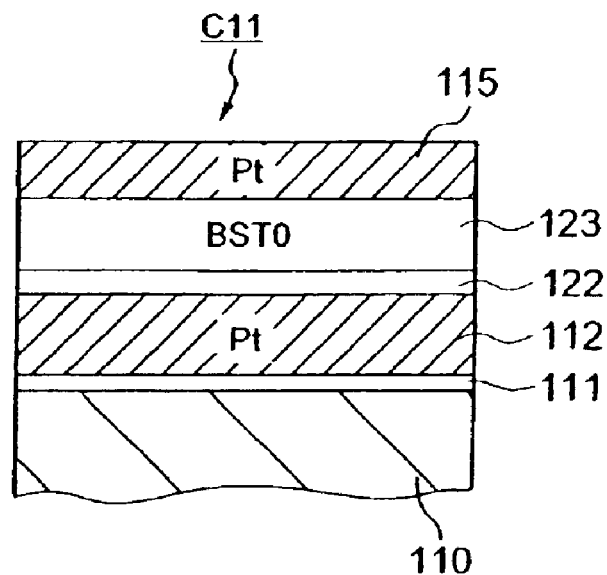
FIG. 22 is a sectional view showing the structure of the fifth preferred embodiment of a high-dielectric capacitor according to the present invention.

FIG. 22 shows the structure of the fifth preferred embodiment of a high-dielectric capacitor C11 according to the present invention so as to correspond to the third preferred embodiment shown in FIG. 13B. A first BSTO film 122 and a second BSTO film 123 are stacked on a bottom Pt electrode 112, and a top Pt electrode 115 is formed thereon. The manufacturing process is the same as that in the third preferred embodiment (FIGS. 14A–14C). At a heat treatment step for crystallizing the first BSTO film 122, Pt is diffused in the first BSTO film 122. The second BSTO film 123 formed thereafter is crystallized before the top Pt electrode 115 is deposited, so that Pt is hardly diffused in the second BSTO film 123.

In the case of this preferred embodiment, there is originally no problem in that the spontaneous polarization is degraded by the reducing power of hydrogen or the like. However, since the second BSTO film 123 serves as the capacitor dielectric film of a substantial high-dielectric capacitor having a small leak, it is possible to obtain excellent electrical property. In addition, since the element constituting the bottom electrode is not diffused into the second BSTO film 123, there is an advantage in that the scaling of the thickness of the film can be easily carried out.

Figure 23:
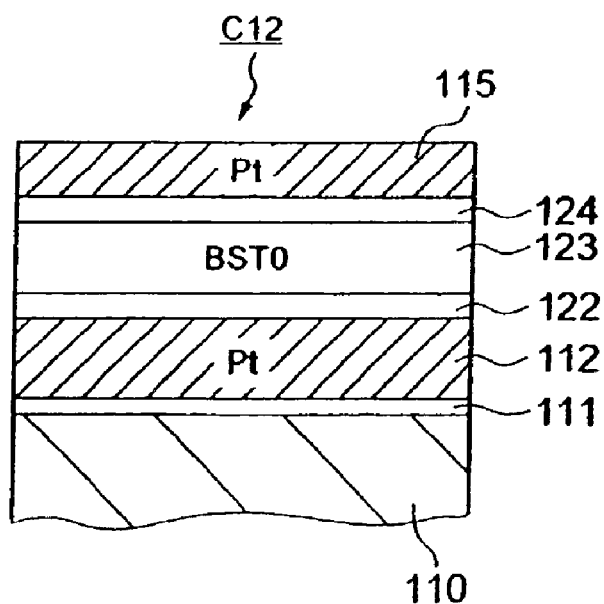
FIG. 23 is a sectional view showing the structure of the sixth preferred embodiment of a high-dielectric capacitor according to the present invention.

FIG. 23 shows the structure of the sixth preferred embodiment of a high-dielectric capacitor C12 according to the present invention so as to correspond to the fourth preferred embodiment shown in FIG. 19B. A first BSTO film 122, a second BSTO film 123 and a third BSTO film 124 are stacked on a bottom Pt electrode 112; and a top Pt electrode 115 is formed thereon. The manufacturing process is the same as that in the fourth preferred embodiment (FIGS. 20A–20C). At a heat treatment step for crystallizing the first BSTO film 122, Pt is diffused in the first BSTO film 122. In addition, Pt is diffused in the third BSTO film 124 by crystallization after the top Pt electrode 115 is deposited. In the second BSTO film, Pt is hardly diffused.

By employing such a structure, the reduction of the BSTO by hydrogen is effectively prevented, because the metallized layer 124. Also in this preferred embodiment, it is possible to easily carry out the scaling of the thickness of the film.

The first metal oxide dielectric films in each of the above described preferred embodiments may comprise a plurality of layers formed by a plurality of steps. Specifically, the steps of depositing a thin metal oxide dielectric film, carrying out a heat treatment for crystallization, and depositing the next metal oxide dielectric film are repeated.

By such a technique, the total thickness of the first metal oxide dielectric film can be decreased. Because the depth of the Pt diffusion into the top metal oxide dielectric film from the bottom Pt electrode can be smaller than that of a first metal oxide dielectric film formed of a single layer, by overlapping thin metal oxide dielectric films while sequentially crystallizing the films.

The present invention should not be limited to the above described preferred embodiments. For example, while the PZT has been used as the metal oxide ferroelectric film of the ferroelectric capacitor in the above described preferred embodiments, other ferroelectric films, e.g., SBT (SrBi$_2$Ta$_2$O$_9$), may be used. The high-dielectric capacitor may also use other metal oxide dielectric films having a relative dielectric constant of 50 or more.

Moreover, the top and bottom electrodes should not be limited to Pt electrodes, but the top and bottom electrodes may be formed of Ru, RuO$_2$, SrRuO$_3$, Ir and their oxides or the like.

As described above, according to the present invention, the metal oxide dielectric film has a plurality of layers, so that it is possible to obtain a semiconductor integrated circuit having a capacitor, which has a small leak, which can easily carry out the thickness of the film and which has excellent charge holding characteristics.

Figure 24:
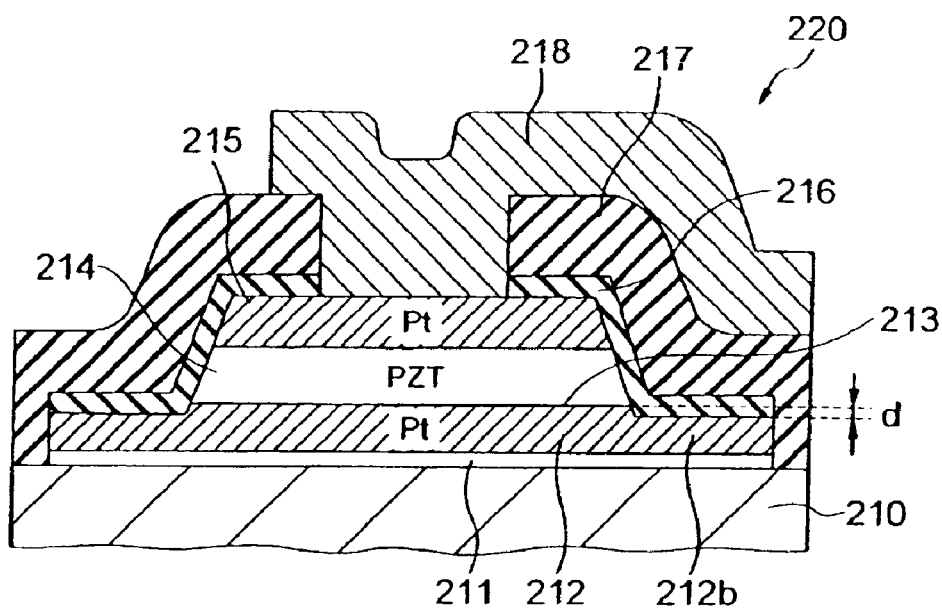
FIG. 24 is a sectional view showing a seventh preferred embodiment of a ferroelectric capacitor according to the present invention.

FIG. 24 shows a sectional structure of a seventh preferred embodiment of a ferroelectric capacitor 220 formed on a silicon substrate 210 covered with an insulator film, according to the present invention. The top Pt electrode 215 and PZT film 214 of the ferroelectric capacitor 220 are sequentially patterned, and the bottom Pt electrode 212 thereof is patterned so as to have a portion 212b extending to the outside of the PZT film 214. In this preferred embodiment, an adhesion film 211 for improving the adhesion of the bottom Pt electrode 212 to an oxide film is formed below the bottom Pt electrode 212.

In this preferred embodiment, the surface of the portion 212b extending to the outside of the PZT film 214 of the bottom Pt electrode 212 is over-etched at an etching step, so that the level of the surface is lower than that of the layer 213 between the PZT film 214 and the bottom Pt electrode 212 by d. In addition, a protective film 216 against hydrogen gas and a halogen gas is formed so as to cover a range extending from the extending portion 212b of the bottom Pt electrode 212 to the surface of the top Pt electrode 215 via the sides of the PZT film 214 and top Pt electrode 215.

The ferroelectric capacitor 220 is covered with a passivation film (or an interlayer insulator film) 217 of an insulator film, such as a silicon oxide film, and a contact hole is formed in the passivation film 217 so that a metal interconnection 218 is connected to the ferroelectric capacitor 220. The bottom Pt electrode 212 also contacts an interconnection (not shown) or a terminal layer (not shown) of a MOS transistor (not shown) at an appropriate position.

Figure 25A:
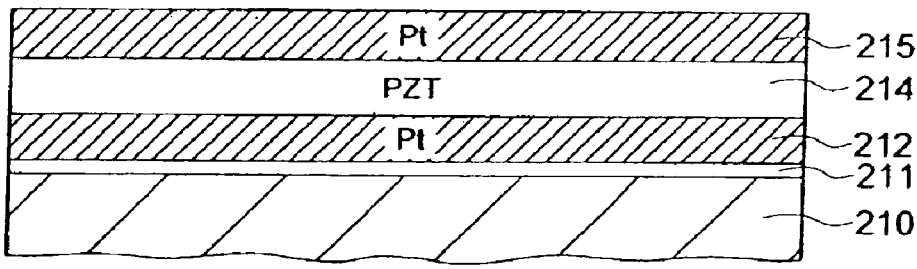
FIGS. 25A through 25D are sectional views showing a process for manufacturing the ferroelectric capacitor of FIG. 24.

FIGS. 25A through 25D are sectional views showing a process for manufacturing a ferroelectric capacitor 220 in this preferred embodiment. As shown in FIG. 25A, an adhesion film 211 having a thickness of 20 nm and a Pt film 212 having a thickness of 150 nm serving as a material of a bottom electrode are sequentially deposited on a substrate 210 by sputtering. Subsequently, a PZT film 214 is deposited as a ferroelectric film by the sol-gel method or sputtering method so as to have a thickness of 200 nm. After the PZT film 214 is deposited, a heat treatment is carried out at 750° C. in an atmosphere of oxygen to crystallize the PZT film 214. Moreover, a Pt film 215 having a thickness of 100 nm serving as a material of a top electrode is deposited on the PZT film 214 by sputtering. The materials used for the adhesion film are Al, Ti, Zr, Mg, MgTi and their oxides.

Figure 25B:
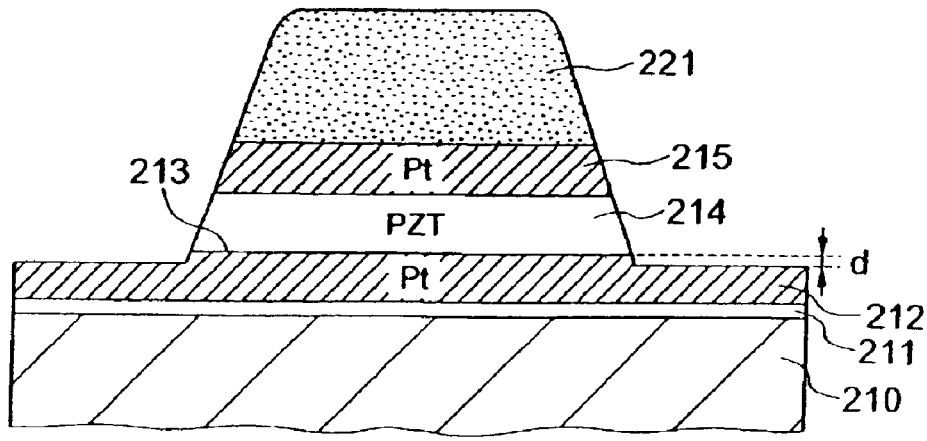
Figure 25C:
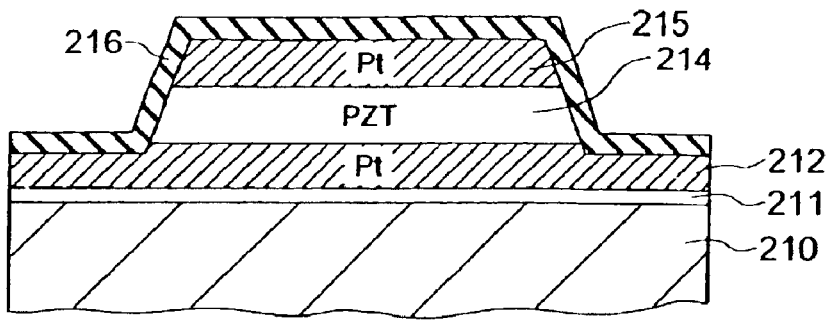

Then, as shown in FIG. 25B, a resist pattern 221 is formed by a lithography process, and the Pt film 215 and the PZT film 214 are sequentially etched using the resist pattern 221 as an etching resistant mask. To the sequential etching of the Pt film 215 and PZT film 214, the RIE method using Ar/Cl$_2$/CF$_4$ gas is applied. At this time, the supply gas is switched so that Cl$_2$ is mainly supplied during etching of the Pt film 215 and CF$_4$ is mainly supplied during etching of the PZT film 214.

At this etching step, as shown in FIG. 25B, the Pt film 212 exposed to the outside of the patterned top Pt electrode 215 and PZT film 214 is over-etched so that the level of the surface of the Pt film 212 is lower than that of the layer 213 between the PZT film 214 and the Pt film 212 by d. According to experiments, the thickness of the surface portion removed from the Pt film 212, i.e., the over-etched amount d, is preferably 0.5% or more of the thickness of the Pt film 212, more preferably 1% or more thereof, so that it is possible to inhibit the penetration of a halogen gas when the Pt film 212 is further etched and to inhibit the penetration of hydrogen after the passivation film is formed. The over-etched amount d is preferably 50% or less of the thickness of the Pt film 212 in order to prevent increase of electrical resistance.

Subsequently, after the resist pattern 221 is removed, a protective film 216 is formed so as to cover the surface of the bottom Pt film 212, the sides of the PZT film 214 and top Pt electrode 215, and the surface of the top Pt electrode. The protective film 216 is preferably an insulator film having a specific resistance of 100 kΩ·cm or more.

Specifically, the protective film 216 is made of material selected from the group consisting of Al$_x$O$_y$, TiO$_x$, ZrO$_x$, MgO$_x$ and MgTiO$_x$. When these materials are used, the thickness of the protective film 216 is in the range of from 2 nm to 300 nm. When the thickness is less than 2 nm, it is not possible to effectively inhibit the penetration of the reducing element. When the thickness exceeds 300 nm, the working time is too long, and the thickness of the whole capacitor is too large, so that it is not suitable for multilayering.

Figure 25D:
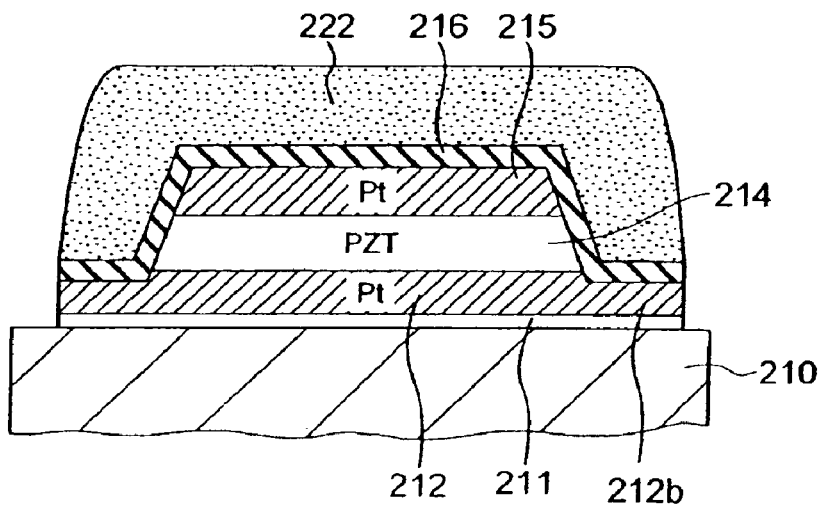

Thereafter, as shown in FIG. 25D, a resist pattern 222 for covering a larger area than the resist pattern 221 is formed. Then, the protective film 216, and the Pt film 212 and Ti film 211 underlying the protective film 216 are sequentially etched, and the Pt film 212 is patterned so as to have a predetermined range of portion 212b extending to the outside of the PZT film 214. Thereafter, the resist pattern 222 is removed, and a passivation film 217 is deposited as shown in FIG. 24. Then, a contact hole is formed, and a metal interconnection 218 is formed. After the contact hole is formed, a recovery heat treatment is preferably carried out at a temperature of about 650° C. in an atmosphere of oxygen. The metal interconnection 218 is, e.g., a TiN/Al stacked film.

According to this preferred embodiment, at the etching step of FIG. 25D, the level of the surface of the extending portion 212b of the bottom Pt electrode 212 is lower than the level of the layer 213 between the PZT film 214 and the bottom Pt electrode 212. Thus, it is possible to prevent the etching gas, such as Cl or F, from penetrating into the layer 213 from the etched end surface. Therefore, the layer 213 is not damaged. For the same reason, even if hydrogen annealing is carried out in the state of FIG. 24 wherein the protective film 216 and the passivation film 217 are formed, it is possible to inhibit hydrogen from penetrating into the layer 213 via the passivation film 217.

Thus, according to this preferred embodiment, it is possible to obtain a reliable ferroelectric capacitor which is able to prevent the decrease of remnant polarization and the peeling of films.

Figure 1:
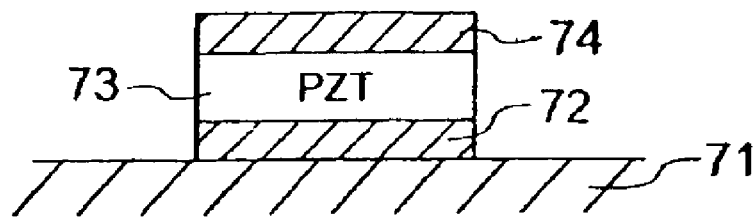
FIG. 1 is a sectional view showing an example of a structure of a conventional capacitor.
Figure 2:
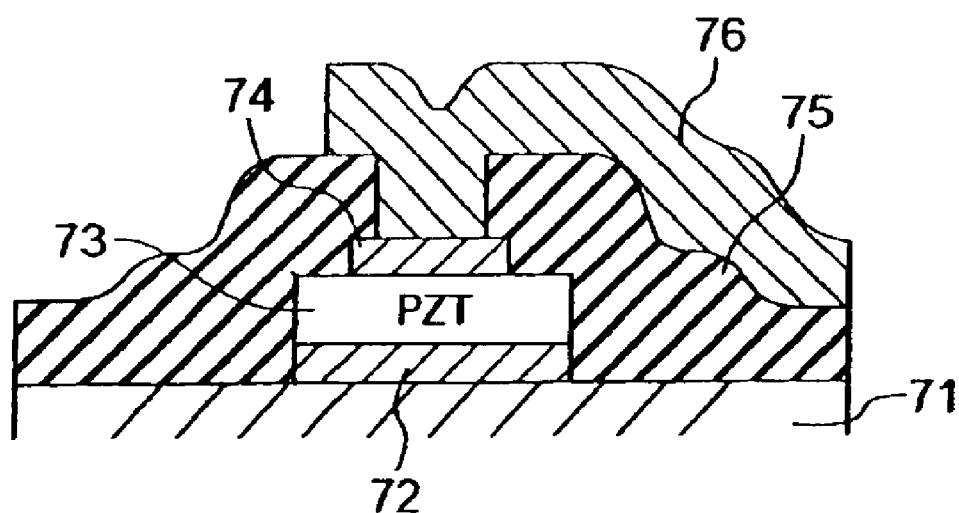
FIG. 2 is a sectional view showing the integrated structure of a conventional ferroelectric capacitor.

The Q-V characteristics of the conventional structure shown in FIG. 1A and the ferroelectric capacitor in this preferred embodiment are shown in FIG. 16.

In addition, an example of the detailed structure of the substrate 210 in this preferred embodiment is shown in FIG. 15.

Figure 26:
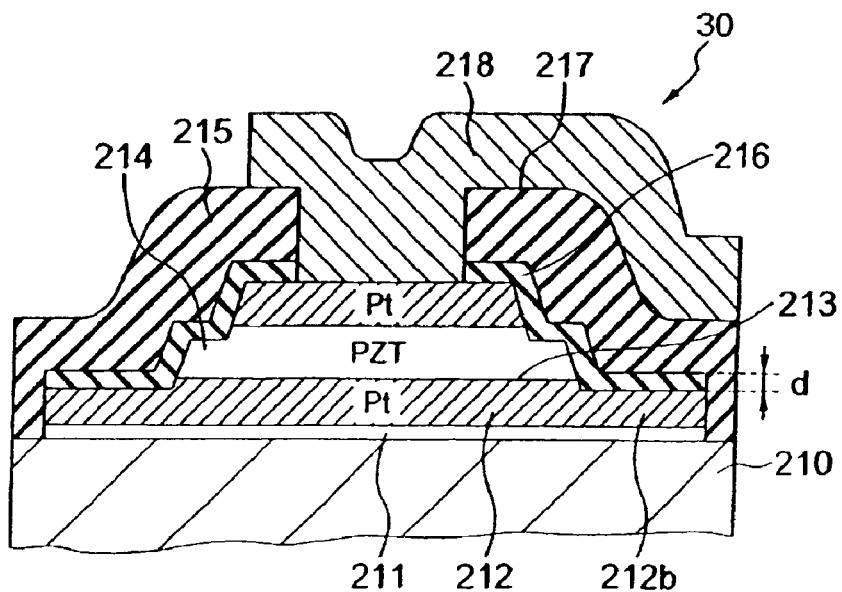
FIG. 26 is a sectional view showing an eighth preferred embodiment of a ferroelectric capacitor according to the present invention.

FIG. 26 is a sectional view showing the structure of an eighth preferred embodiment of a ferroelectric capacitor according to the present invention, and FIGS. 27A through 27E are sectional views showing a manufacturing process in this preferred embodiment. The same reference numbers are applied to parts corresponding to those in the preceding preferred embodiments, and the detailed descriptions thereof are omitted. The protective film 216 can be omitted as shown in FIGS. 13B and 19B.

Figure 27A:
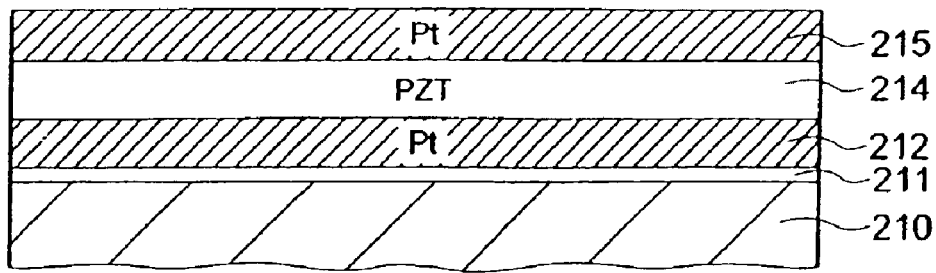
FIGS. 27A through 27E are sectional views showing a process for manufacturing the ferroelectric capacitor of FIG. 26.
Figure 27B:
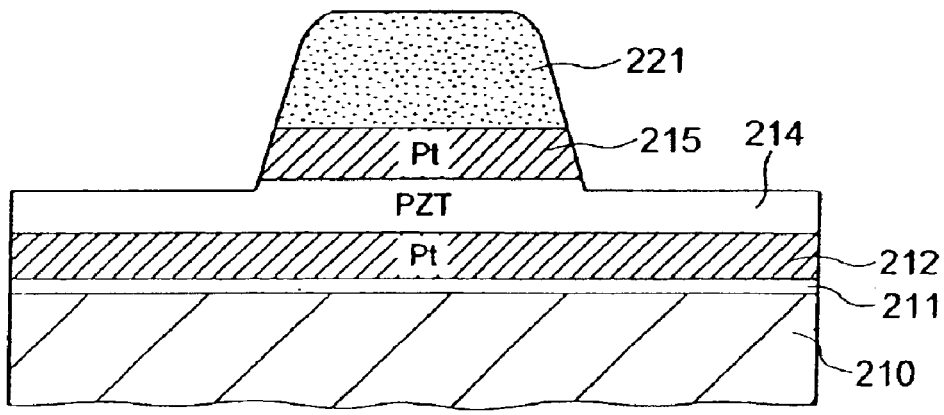
Figure 27C:
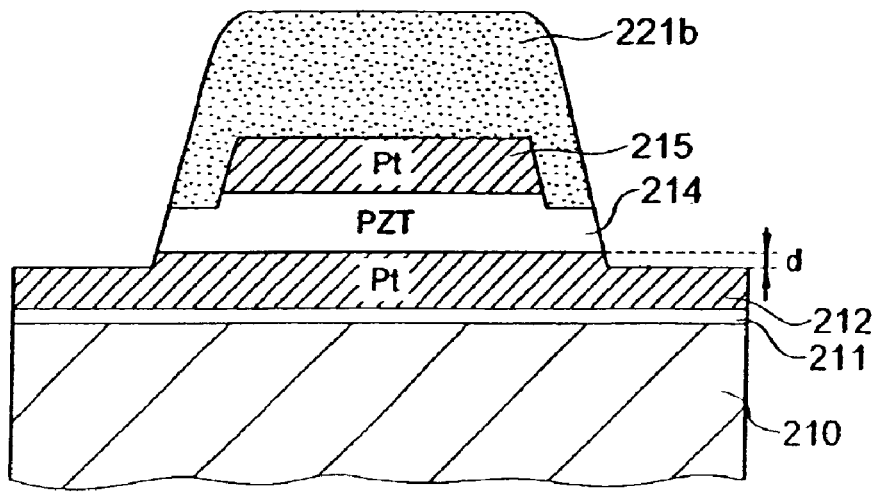
Figure 27D:
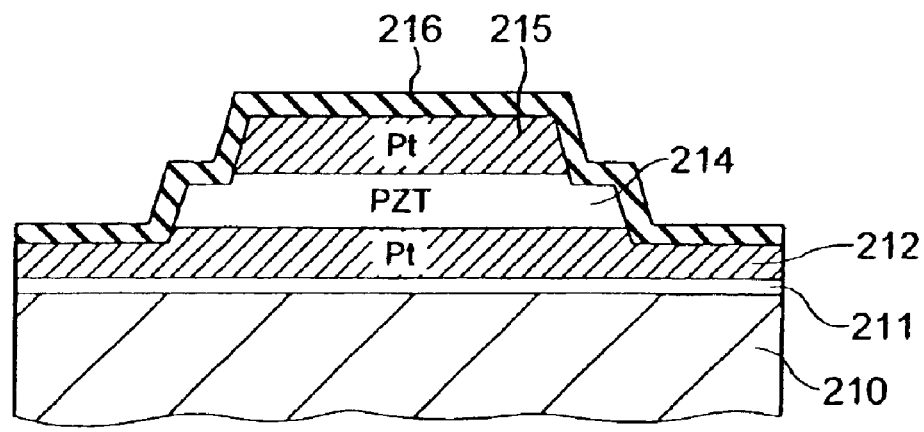

As shown in FIG. 27A, required films are sequentially deposited similar to the preceding preferred embodiments. Thereafter, as shown In FIG. 27B, a top Pt film 215 is etched using a resist pattern 221, and subsequently, a PZT film 214 is etched. At this time, as shown in the figure, the etching of the PZT film 214 is stopped on the way. Then, the resist pattern 221 is removed, and a resist pattern 221b having a slightly larger area than that of the resist pattern 221 is newly formed to etch the rest of the PZT film 214 as shown in FIG. 27C. Similar to the preceding preferred embodiments, a part of the surface of the bottom Pt film 212 is sequentially etched at the step of patterning the PZT film 214.

Figure 27E:
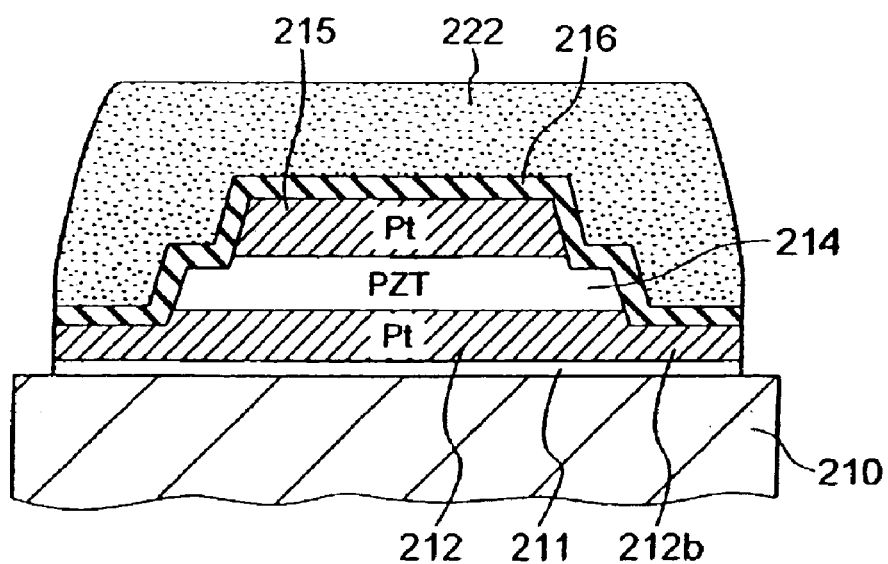

Thereafter, similar to the preceding preferred embodiments, a protective film 216 is deposited (FIG. 27D), and a resist pattern 222 is formed to sequentially etch the protective film 216 and the bottom Pt film 212 (FIG. 27E).

According to this preferred embodiment, in addition to the advantages obtained by the preceding preferred embodiments, the following advantages are obtained. That is, at the step of patterning the PZT film 214 shown In FIG. 27C, the layer between the top Pt electrode 215 and the PZT film 214 is protected by the resist pattern 221b. Thus, even if the Pt film is adhered to the side of the PZT film 214 when the bottom Pt film 212 is over-etched, the layer between the top Pt electrode 215 and the PZT film 214 is protected, so that it is possible to surely prevent the short-circuit between the top and bottom electrodes.

As described above, according to the present invention, it is possible to provide a semiconductor device having a ferroelectric capacitor, which can effectively inhibit the reducing element from causing the damage to the layer between the ferroelectric film and the bottom electrode and from peeling the films to reduce the degradation in remnant polarization.

Figure 28A:
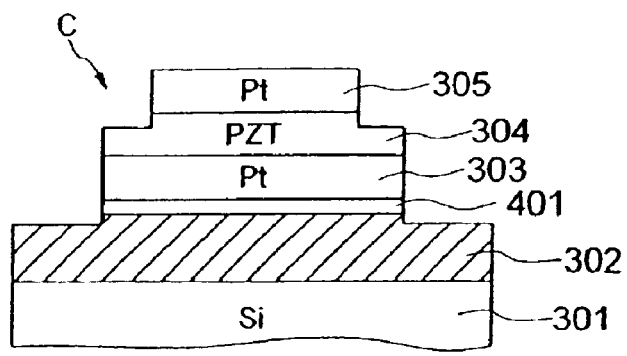
FIGS. 28A through 28D are sectional views showing a process for manufacturing a ninth preferred embodiment of a ferroelectric capacitor of an FRAM according to the present invention.

FIGS. 28A through 28D show a process for manufacturing a ninth preferred embodiment of a ferroelectric capacitor of a FRAM according to the present invention. In this preferred embodiment, a hydrogen barrier film is provided in an interlayer insulator film covering a ferroelectric capacitor so as to surround the ferroelectric capacitor. As shown in FIG. 28A, after a transistor (not shown) is formed on a silicon substrate 301, the surface thereof is covered with an interlayer insulator film 302 of a silicon oxide film or the like to be flattened. A ferroelectric capacitor C comprising a bottom Pt electrode 303, a PZT film 304 and a top Pt electrode 305 is formed on the interlayer insulator film 302 via an adhesion layer 401.

Specifically, the bottom Pt electrode 303 having a thickness of about 100 nm is deposited by sputtering, and the PZT film 304 having a thickness of about 150 nm is deposited thereon by a sputtering method or sol-gel method to be crystallized by the rapid thermal anneal (RTA) method at 650° C. in an atmosphere of oxygen. On the PZT film 304, the top Pt electrode film having a thickness of about 50 nm is deposited. Then, these stacked films are sequentially etched to form the ferroelectric capacitor C. At this time, the top Pt electrode 305 is etched using a first mask material (not shown), and the PZT film 304 and the bottom Pt electrode film 303 are etched using a second mask material having a larger area than that of the first mask material.

Figure 28B:
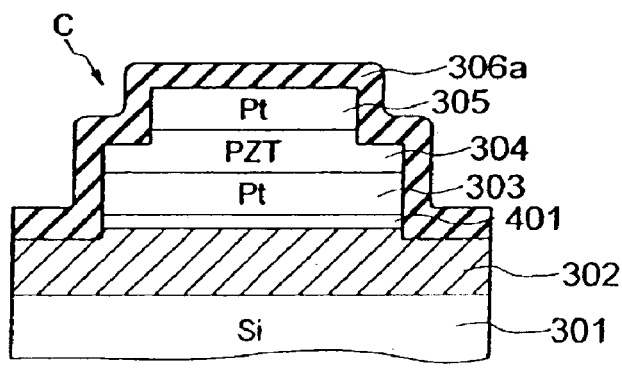
Figure 28C:
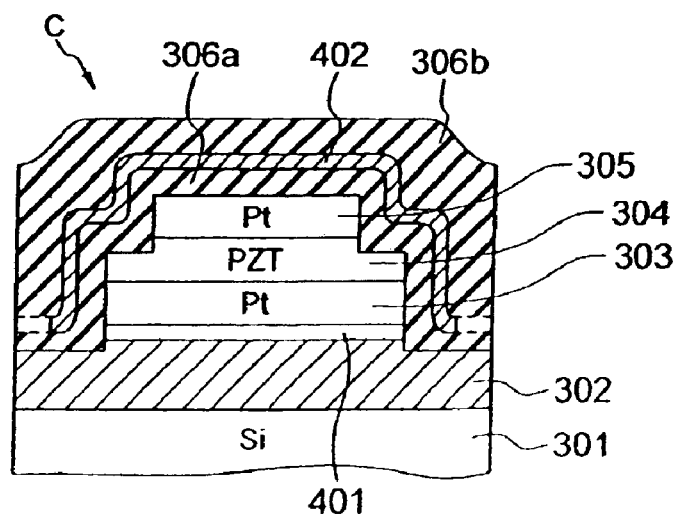

The ferroelectric capacitor C thus formed is covered by a thin interlayer insulator film 306a is deposited as shown in FIG. 28B. Then, as shown in FIG. 28C, a hydrogen barrier film 402 is deposited on the interlayer insulator film 306a, and an interlayer insulator film 306b is deposited thereon. That is, the interlayer insulator films 306a and 306b are formed so that the hydrogen barrier film 402 is provided between the interlayer insulator films 306a and 306b.

Figure 28D:
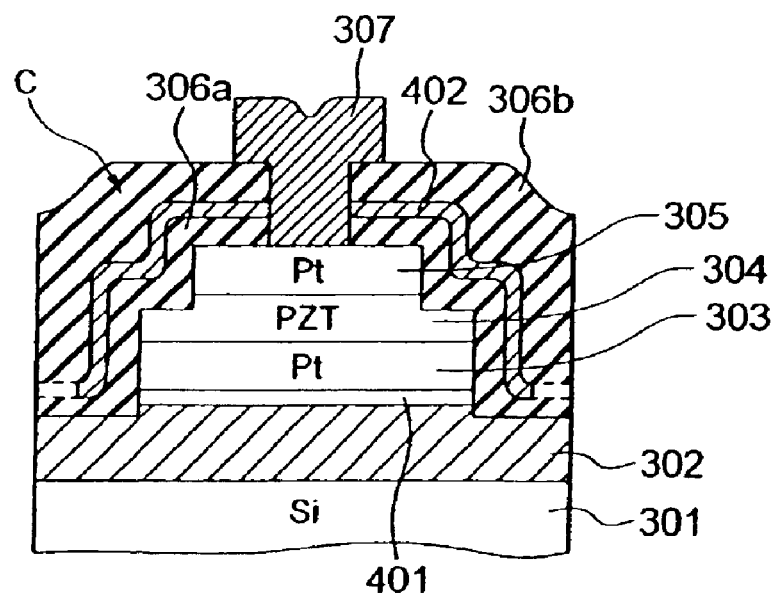

Furthermore, in this preferred embodiment, the thickness of the interlayer insulator film 306a is 0.2 times or more and twice or less as large as the thickness of the top Pt electrode 305, the PZT film 304 and the bottom Pt electrode 303, or 0.05 times or more and three times or less as large as the thickness of the ferroelectric capacitor C, so that it Is possible to deposit a good coverage of the hydrogen barrier film 402. Finally, as shown in FIG. 28D, a contact hole is formed, and a terminal interconnection 307 connected to the top Pt electrode 305 is formed.

The hydrogen barrier film 402 runs from the contact 307 to the side of the bottom electrode 303 as shown by the solid line. However, the hydrogen barrier film 402 may extend to further area, for example, a next element area, as shown by the broken line. This expression is applicable to following various embodiments.

Also in this preferred embodiment, the hydrogen barrier film 402 is a film having a hydrogen diffusion coefficient of $1E-5$ cm$^2$/s or less, preferably a metal oxide film having a specific resistance of 1 k$\Omega$-cm or more, typically an aluminum oxide ($Al_2O_3$) film. When the hydrogen barrier film is thus inserted into the interlayer insulator film, it is possible to prevent the degradation in the performance of the ferroelectric capacitor. In addition, the hydrogen barrier film provided in the interlayer insulator film can inhibit the damage to the ferroelectric capacitor at the step of depositing the passivation film (usually an SiN film) for covering the top surface of the element. Moreover, the interlayer insulator film 306a serves to prevent a reaction from being caused by directly contacting the hydrogen barrier film with the ferroelectric capacitor C. In addition, since the $Al_2O_3$ film is an insulator film, the $Al_2O_3$ film can be inserted into the interlayer insulator film over the whole surface without the need of patterning, and the short-circuit of the contact to the diffusion layer is not caused. Moreover, the hydrogen barrier film is formed via the interlayer insulator film, so that it is possible to decrease the stress of the hydrogen barrier film.

Figure 28E:
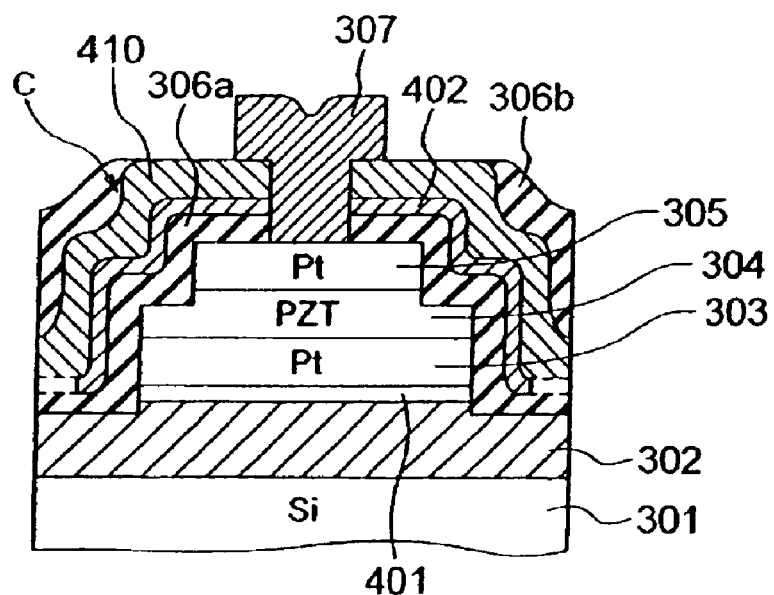
FIG. 28E shows a variation of FIG. 28D.

FIG. 28E shows a structure where a silicon nitride (SiN) film 410 is deposited on the hydrogen barrier film 402.

In this preferred embodiment, the hydrogen barrier film is preferably at least one selected from the group consisting of $Al_xO_y$, $TiO_x$, $ZrO_x$, $MgO_x$ and $MgTiO_x$, in addition to $Al_2O_3$.

Figure 29A:
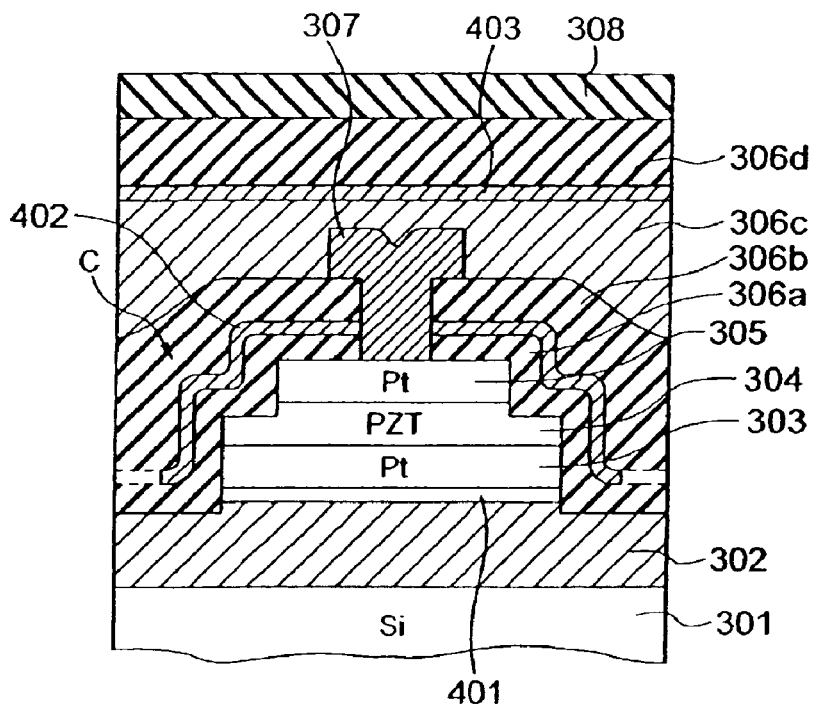
FIGS. 29A through 29D are sectional views showing variations of a tenth preferred embodiment of a ferroelectric capacitor according to the present invention.

FIG. 29A Is a sectional view of the tenth preferred embodiment of a ferroelectric capacitor according to the present invention, wherein interlayer insulator films 306c and 306d are stacked on the structure in the above described ninth preferred embodiment, and a hydrogen barrier film 403 is provided between the interlayer insulator films 306c and 306d under a passivation film 308 of an SiN film. When a plurality of hydrogen barrier films are thus provided between the interlayer insulator films, it can be expected to more surely prevent the hydrogen diffusion. In addition, it has been confirmed that this structure can effectively reduce the damage due to the deposition of the passivation film of SiN.

Figure 29B:
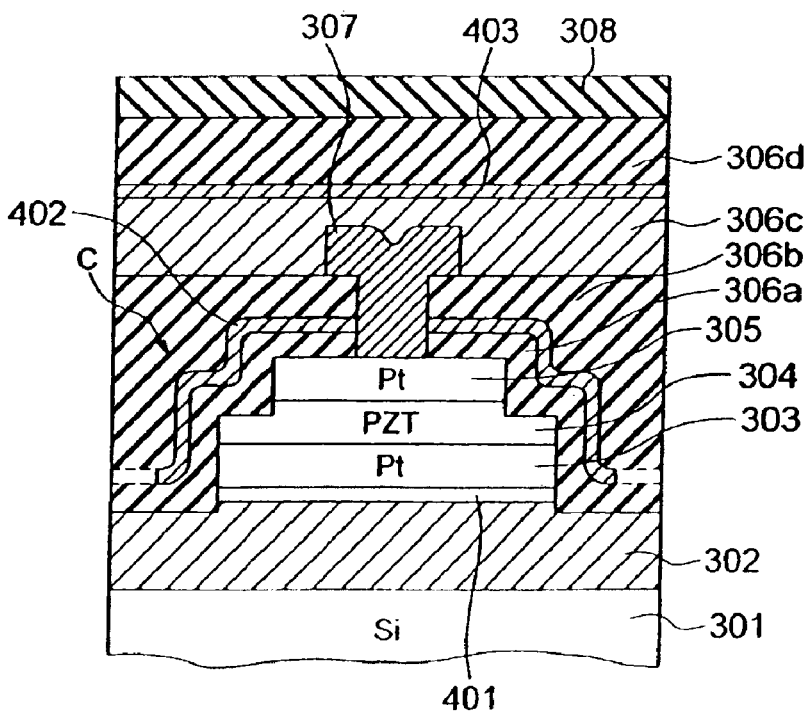

FIG. 29B shows a structure which is based on the structure of FIG. 29A and wherein an interlayer insulator film 306b is flattened and an interconnection 307 is formed thereon.

Figure 29C:
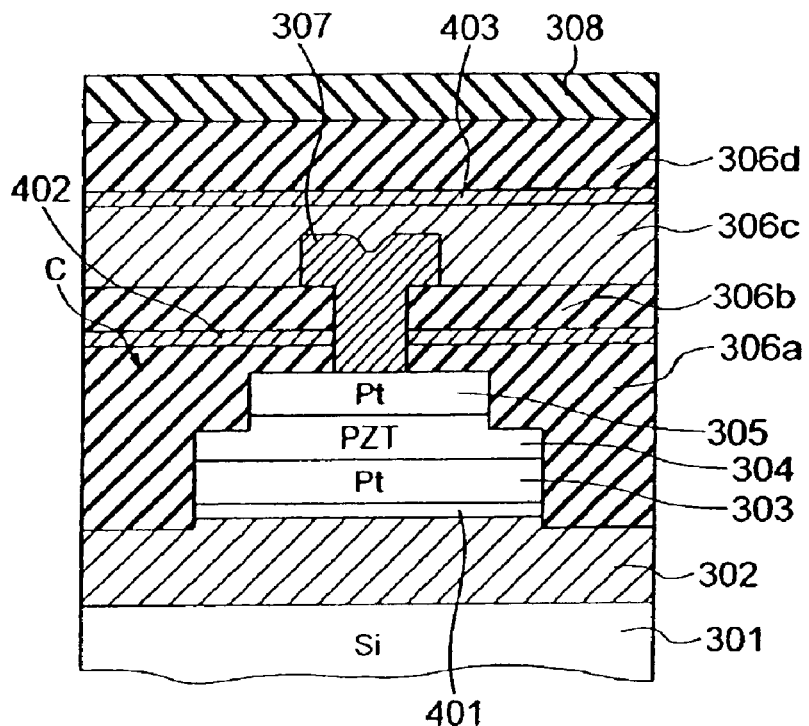

FIG. 29C shows a structure wherein the interlayer insulator film 306a of FIG. 29B is flattened and a hydrogen barrier 402 is formed thereon.

Figure 29D:
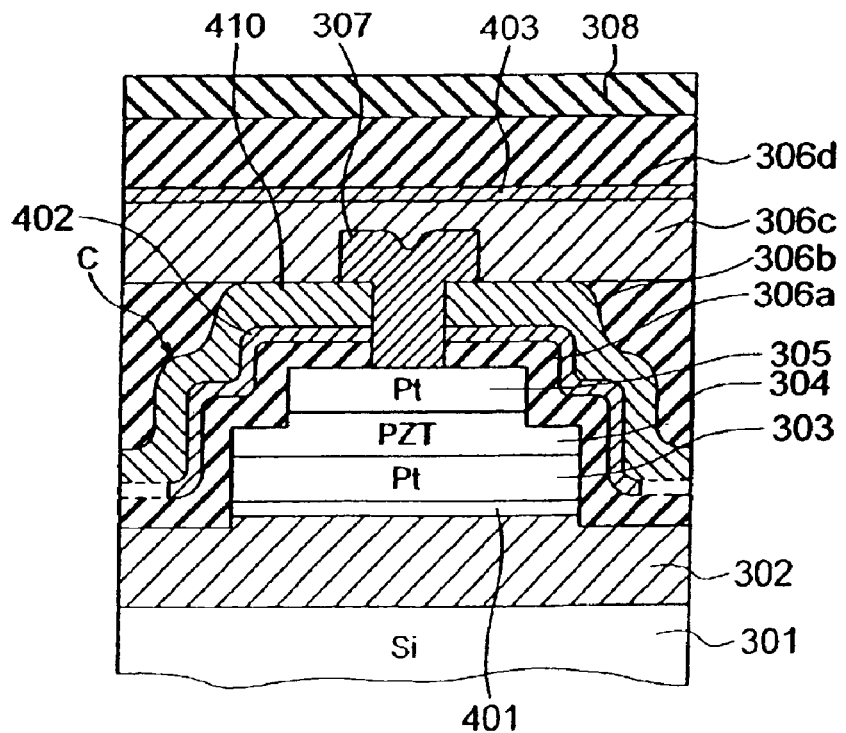

FIG. 29D shows a structure wherein a silicon nitride film 410 is deposited on the hydrogen barrier film 402 In FIG. 29B to enhance barrier performance.

Figure 30A:
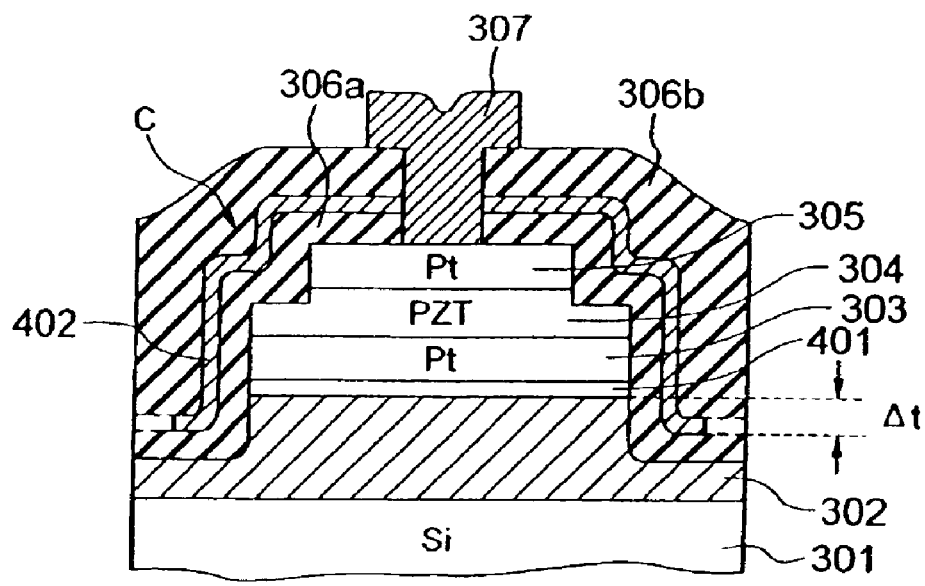
FIGS. 30A and 30B are sectional views showing variations of the eleventh preferred embodiment of a ferroelectric capacitor according to the present invention.

FIG. 30A shows an eleventh preferred embodiment obtained by modifying the structure in the ninth preferred embodiment. That is, in this preferred embodiment, the level of the bottom of a hydrogen barrier film 402 provided between interlayer insulator films 306a and 306b is lower than the level of the bottom of a bottom Pt electrode 303 of a ferroelectric capacitor C by Δt. In such a structure, it is possible to narrow the diffusion path of hydrogen gas supplied to the region of the ferroelectric capacitor C via the interlayer insulator film below the hydrogen barrier film 402, so that it is possible to more effectively prevent the hydrogen diffusion. Moreover, it is possible to obtain the same advantages as those in the tenth preferred embodiment.

Figure 30B:
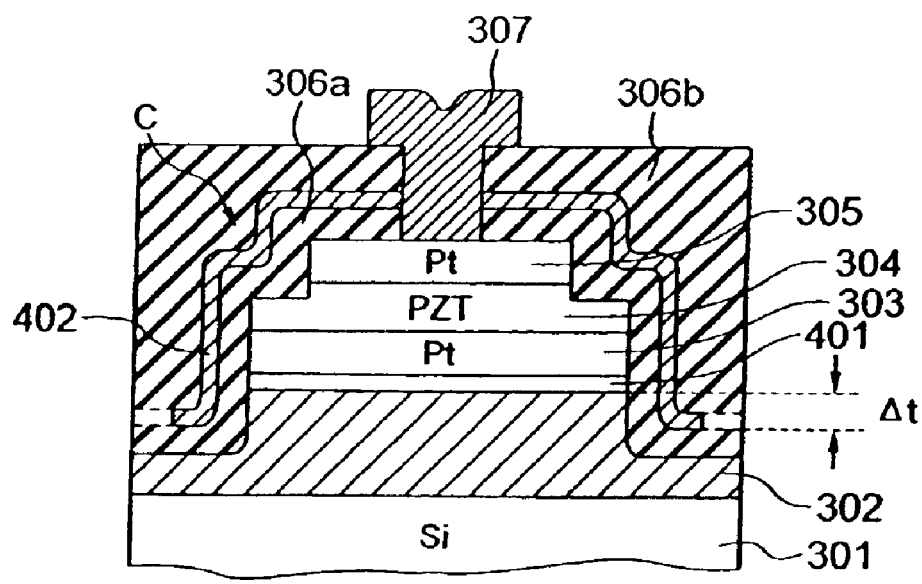

FIG. 30B shows a structure which is based on the structure of FIG. 30A and wherein a hydrogen barrier film 402 is patterned in a predetermined range covering the region of a ferroelectric capacitor C. Since it is possible to more effectively prevent the hydrogen diffusion by arranging the hydrogen barrier film 402 below the bottom of a bottom Pt electrode 303 around the capacitor, it can be expected to sufficiently prevent the diffusion of hydrogen even if the hydrogen barrier 402 is thus partially inserted in the interlayer insulator film, not in the whole surface of the interlayer insulator film. In addition, in FIG. 30B, the interlayer insulator film 306b is flattened.

FIGS. 31A through 31G show a process for manufacturing a twelfth preferred embodiment of a ferroelectric capacitor of a FRAM according to the present invention. In this preferred embodiment, the capacitor has double insulation films on the top electrode.

Figure 31A:
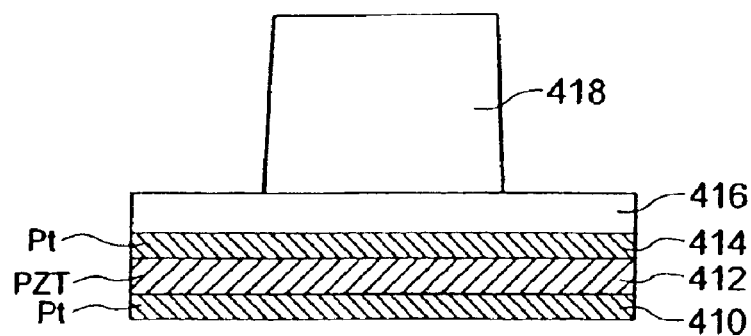
FIGS. 31A through 31G show a process for manufacturing a twelfth preferred embodiment of a ferroelectric capacitor according to the present invention.

As shown in FIG. 31A, on an insulating base layer (not shown), a thin conductive Pt layer 410 for a bottom electrode, a PZT film 412 as a ferroelectric thin film, and a thin conductive Pt layer 414 for a top electrode are successively formed by e.g. sputtering method. Then an oxide film 416 (thin film for a first insulating film) is deposited on the top electrode film 414 for a thickness of 3000 Angstrom using a plasma CVD method. Then a photoresist is coated on the oxide film 416 and is subjected to patterning to obtain a photoresist mask 418 for forming the top electrode.

Figure 31B:
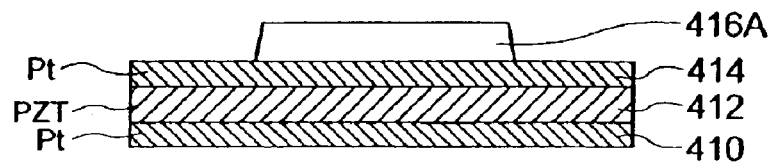

Next, as shown in FIG. 31B, the oxide film 416 is etched using for example RIE (Reactive Ion Etching) to obtain an oxide film mask (first insulating film) 416A. After the etching, the photoresist mask 418 is removed by ashing.

Figure 31C:
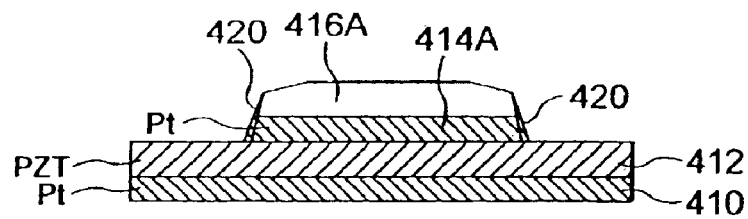

Next, as shown in FIG. 31C, the film for top electrode 414 is dry-etched using the oxide film mask 416A and RIE method. At this etching, slight residual 420 may remain at the side wall of the oxide film mask 416A.

Figure 31D:
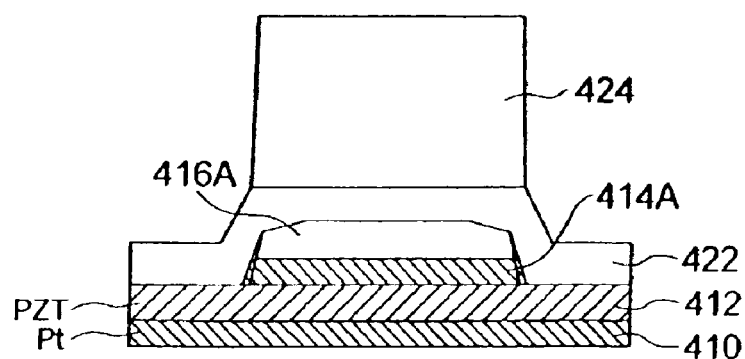

Then as shown in FIG. 31D, an oxide film (second insulating film) 422 of 3000 Angstrom thick is deposited on the top electrode 414A and on the ferroelectric thin film 412 using the plasma electrical method. Then a photoresist is applied and patterned, a photoresist mask for forming a photoresist mask 424 for forming the ferroelectric film.

Figure 31E:
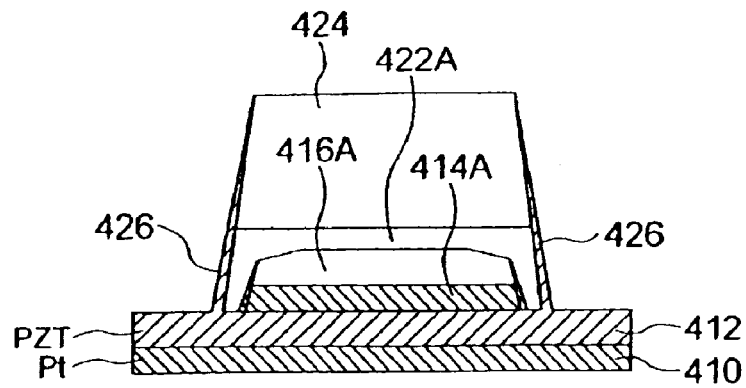

Next, as shown in FIG. 31E, etching the oxide film 422 using the photoresist mask 424 forms an oxide mask (second insulating film) 422A. At this etching, PZT residual 426 may be generated. However, this can be relatively easily removed by hydrochloric acid treatment.

Figure 31F:
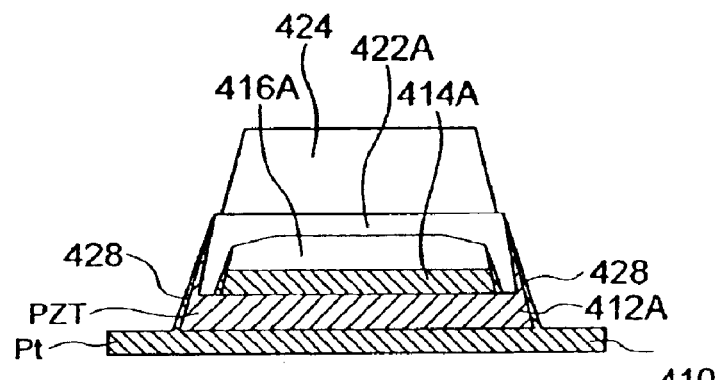

Next, as shown in FIG. 31F, the ferroelectric film 412 is etched by RIE using the photoresist mask 424 to form a patterned ferroelectric film 412A. At this etching, residuals 428 of Pt and PZT tend to be formed. Since the PZT residual of the residual 428 can be relatively easily removed by the hydrochloric acid treatment, the PZT residual is removed. The Pt residual will be removed in the next step for etching the bottom electrode film 410.

Figure 31G:
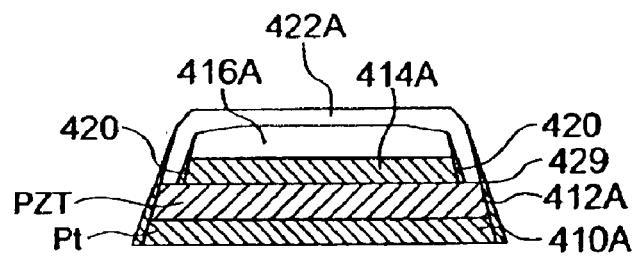

Next, as shown in FIG. 31G, the photoresist mask 424 is removed by ashing. Then the film 410 for bottom electrode is dry-etched by RIE using the oxide mask 422A to obtain the bottom electrode 410A. At this time, a residual 429 of Pt may be generated. However, the residual 420 from the top electrode 414A and the residual 429 from the bottom electrode 410A are isolated by oxide masks 416A and 422A and they are not short-circuited.

In this step, though the PZT film and the Pt film are patterned using the oxide mask, the photoresist which has not been removed by ashing can be used to pattern the PZT and Pt films.

In this embodiment, since two insulating films exist on the top electrode, barrier effect for the top electrode is enhanced.

Furthermore, since the insulating film used as a mask for forming the top electrode is remained, the residual generated during forming the bottom electrode will not be in contact with the top electrode, which will improve yield and reliability of FRAM.

In this embodiment, as shown in 31G, residuals 420 and 429 are remained. However, as shown in 31H, these residuals can be thoroughly removed to improve reliability.

Figure 32:
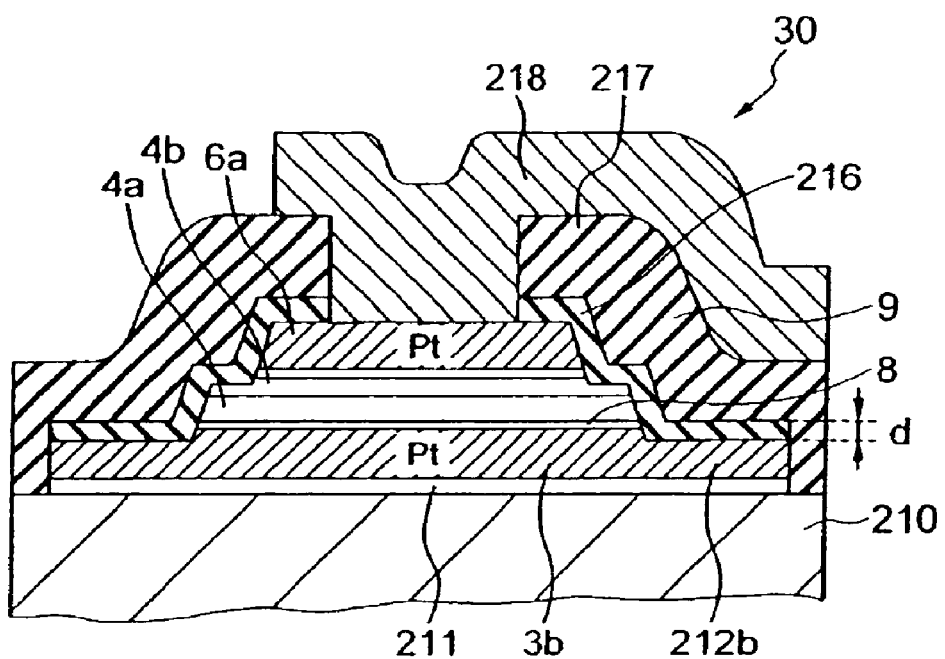
FIG. 32 is a sectional view showing an embodiment which is a combination of structures of FIG. 26 and FIG. 11.

FIG. 32 is a sectional view showing an embodiment which is a combination of structures of FIG. 26 and FIG. 11. In this embodiment, the capacitor has a stepwise configuration and stack of two layers of PZT and two titanium films.

Figure 33:
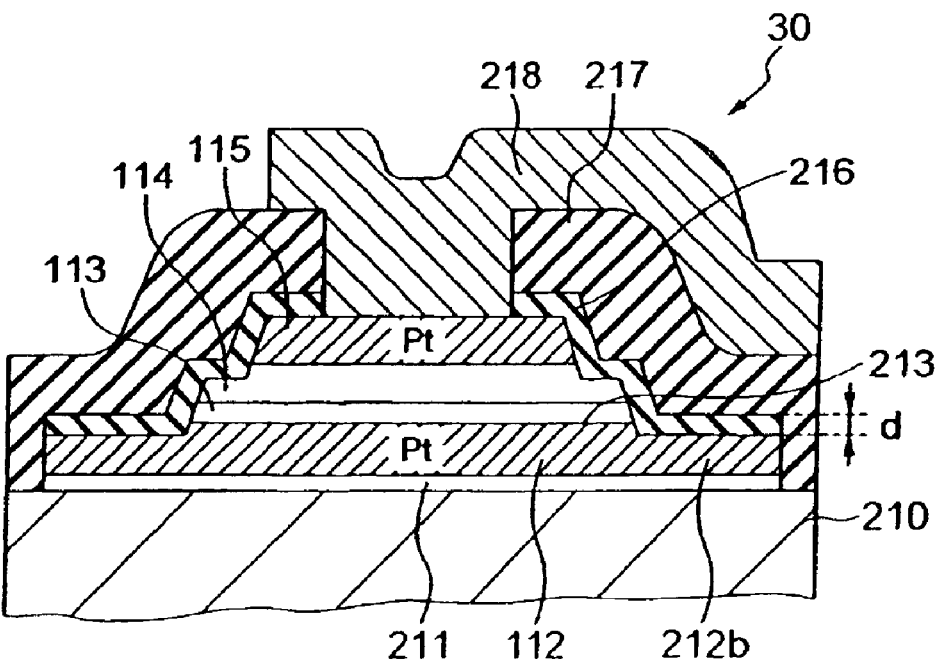
FIG. 33 is a sectional view showing an embodiment which is a combination of structures of FIG. 26 and FIG. 13.

FIG. 33 is a sectional view showing an embodiment which is a combination of structures of FIG. 26 and FIG. 13. In this embodiment, In this embodiment, the capacitor has a stepwise configuration and stack of two layers of PZT.

Figure 34:
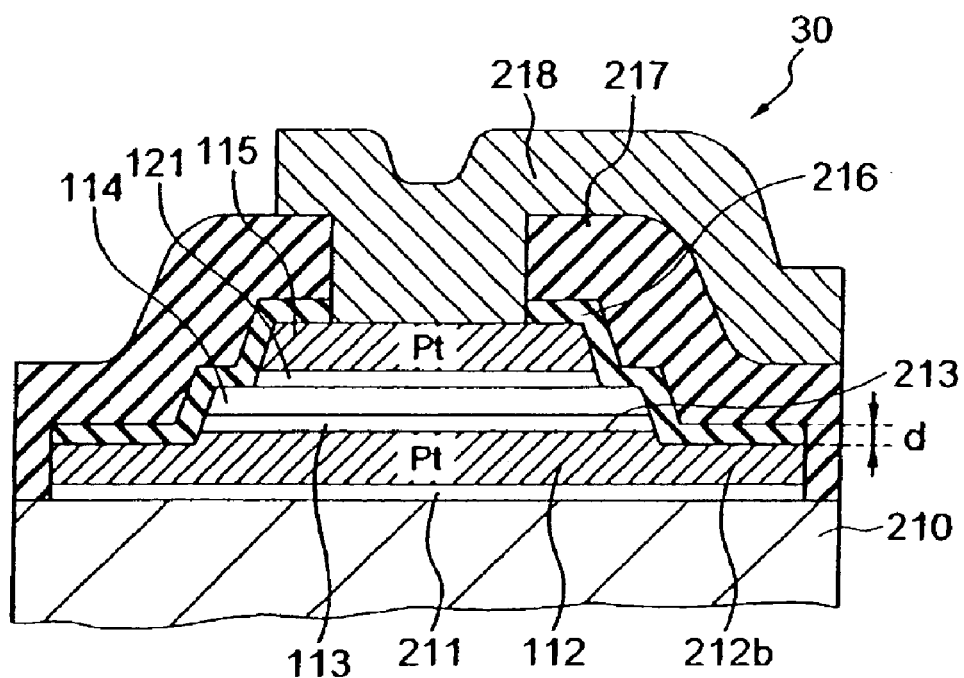
FIG. 34 is a sectional view showing an embodiment which is a combination of structures of FIG. 26 and FIG. 19.

FIG. 34 is a sectional view showing an embodiment which is a combination of structures of FIG. 26 and FIG. 19. In this embodiment, the capacitor has a stepwise configuration and stack of three layers of PZT.

Figure 35:
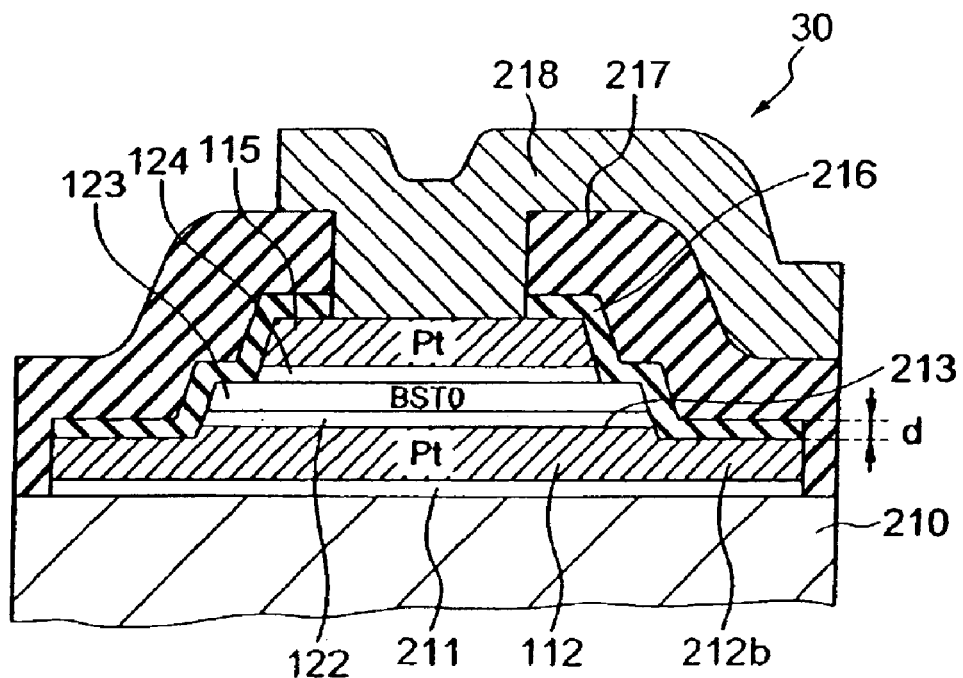
FIG. 35 is a sectional view showing an embodiment which is a combination of structures of FIG. 26 and FIG. 23.

FIG. 35 is a sectional view showing an embodiment which is a combination of structures of FIG. 26 and FIG. 23. In this embodiment, the capacitor has a stepwise configuration and stack of three layers of BSTO.

Figure 36:
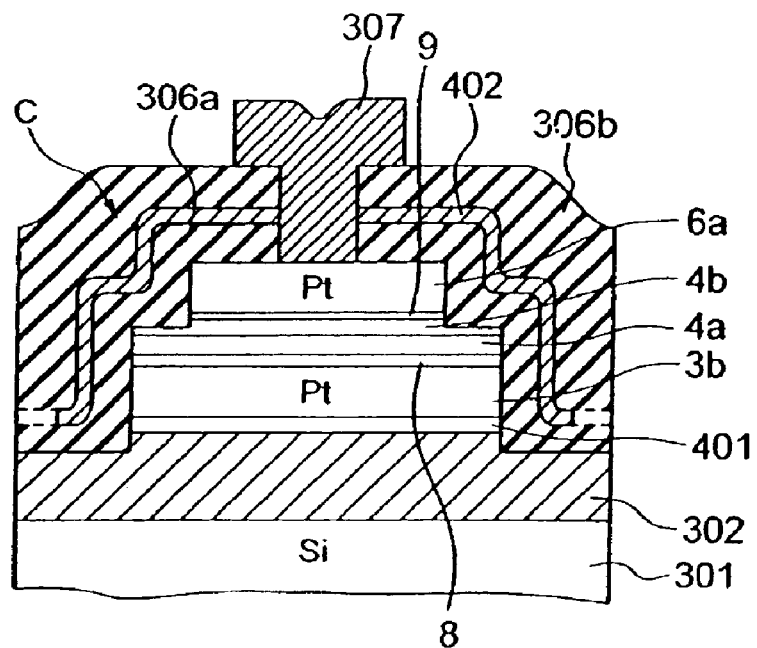
FIG. 36 is a sectional view showing an embodiment which is a combination of structures of FIG. 28D and FIG. 11.

FIG. 36 is a sectional view showing an embodiment which is a combination of structures of FIG. 28D and FIG. 11. In this embodiment, the capacitor has a stepwise configuration with smaller area as going upper layers and stack of two layers of PZT and two titanium films.

Figure 37:
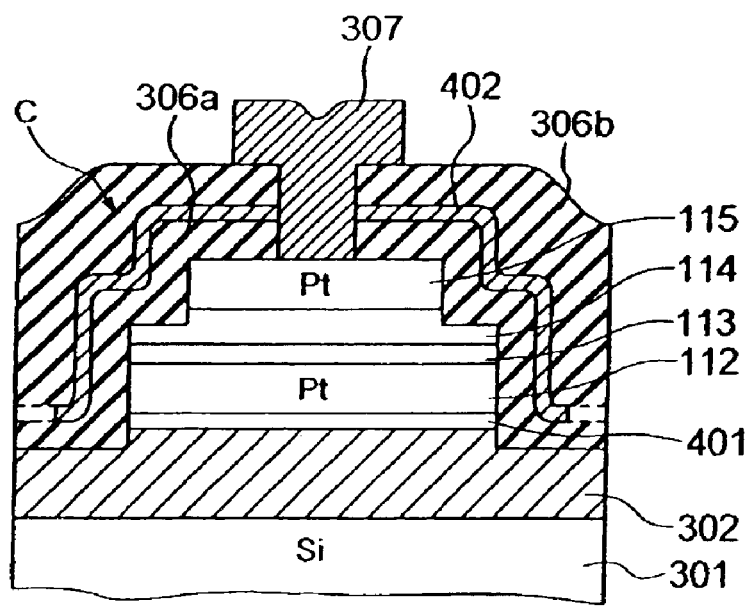
FIG. 37 is a sectional view showing an embodiment which is a combination of structures of FIG. 28D and FIG. 13.

FIG. 37 is a sectional view showing an embodiment which is a combination of structures of FIG. 28D and FIG. 13. In this embodiment, the capacitor has a stepwise configuration with smaller area as going upper layers and stack of two layers of PZT.

Figure 38:
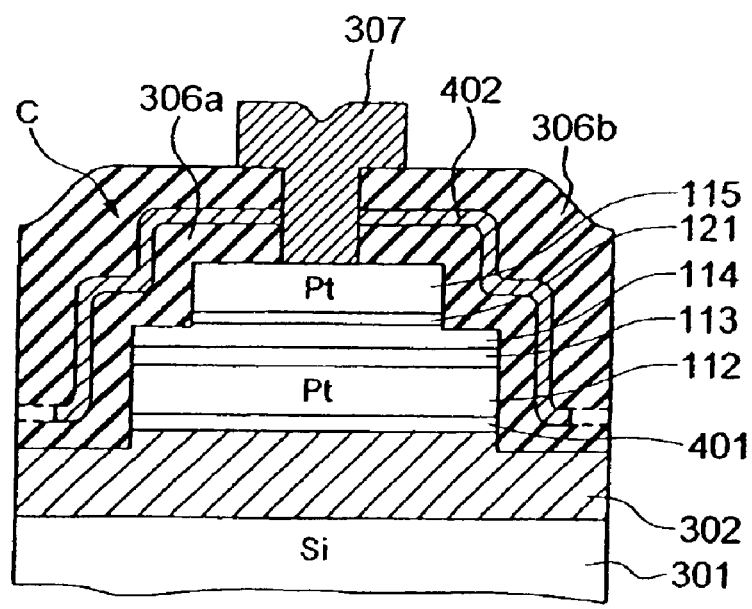
FIG. 38 is a sectional view showing an embodiment which is a combination of structures of FIG. 28D and FIG. 19.

FIG. 38 is a sectional view showing an embodiment which is a combination of structures of FIG. 28D and FIG. 19. In this embodiment, the capacitor has a stepwise configuration with smaller area as going upper layers and stack of three layers of PZT.

Figure 39:
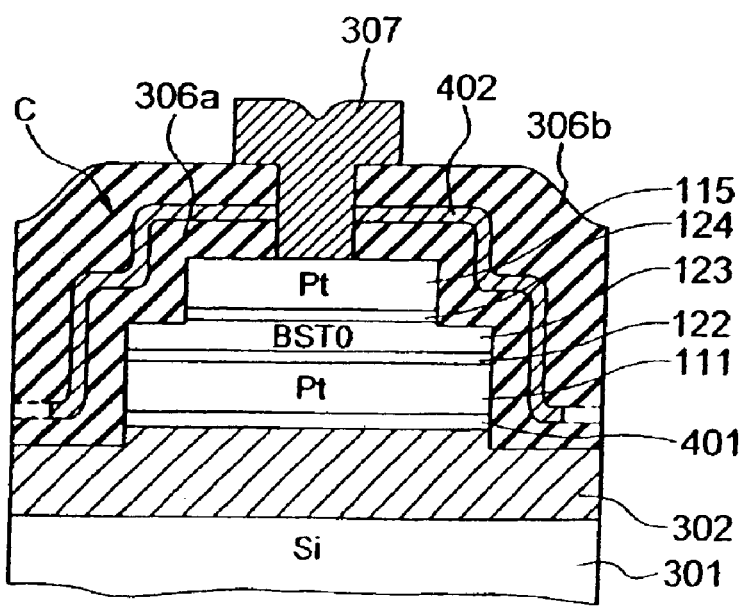
FIG. 39 is a sectional view showing an embodiment which is a combination of structures of FIG. 28D and FIG. 23.

FIG. 39 is a sectional view showing an embodiment which is a combination of structures of FIG. 28D and FIG.

23. In this embodiment, the capacitor has a stepwise configuration with smaller area as going upper layers and stack of three layers of BSTO.

Figure 40:
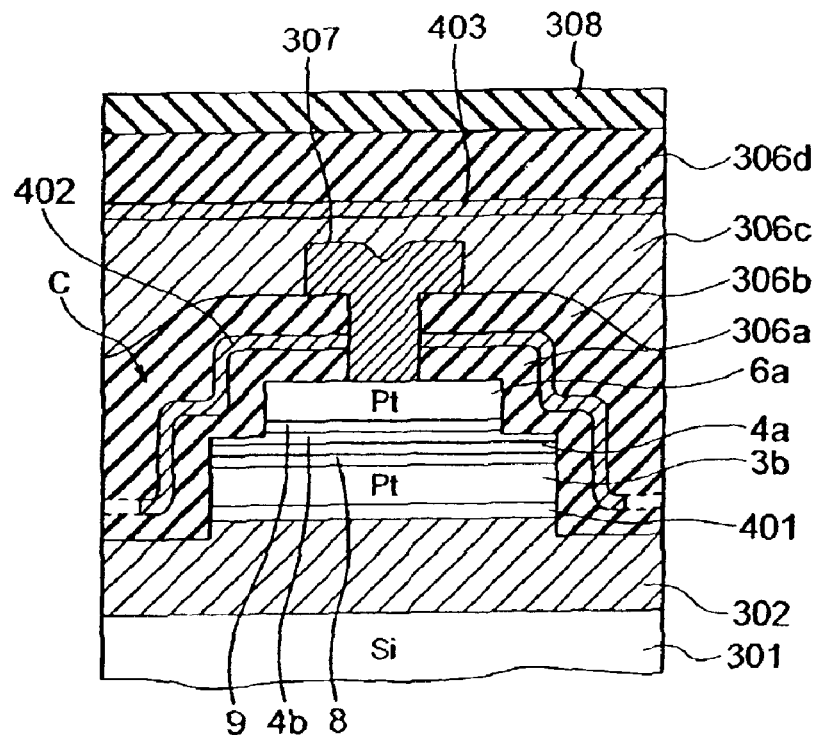
FIG. 40 is a sectional view showing an embodiment which is a combination of structures of FIG. 29A and FIG. 11.

FIG. 40 is a sectional view showing an embodiment which is a combination of structures of FIG. 29A and FIG. 11. In this embodiment, the capacitor has a double barrier structure and stack of two layers of PZT, and two titanium films.

Figure 41:
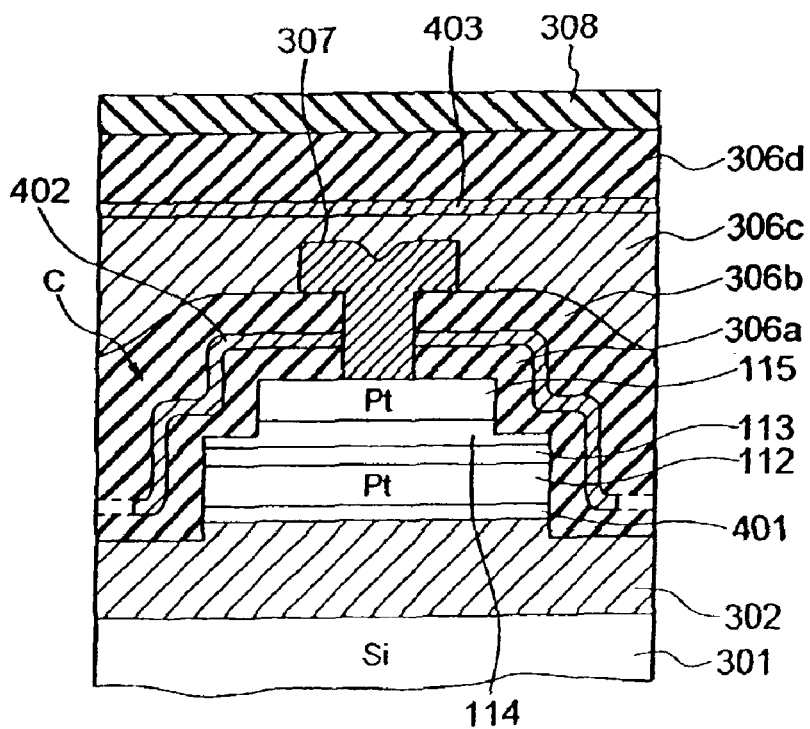
FIG. 41 is a sectional view showing an embodiment which is a combination of structures of FIG. 29A and FIG. 13.

FIG. 41 is a sectional view showing an embodiment which is a combination of structures of FIG. 29A and FIG. 13. In this embodiment, the capacitor has a double barrier structure and stack of two layers of PZT.

Figure 42:
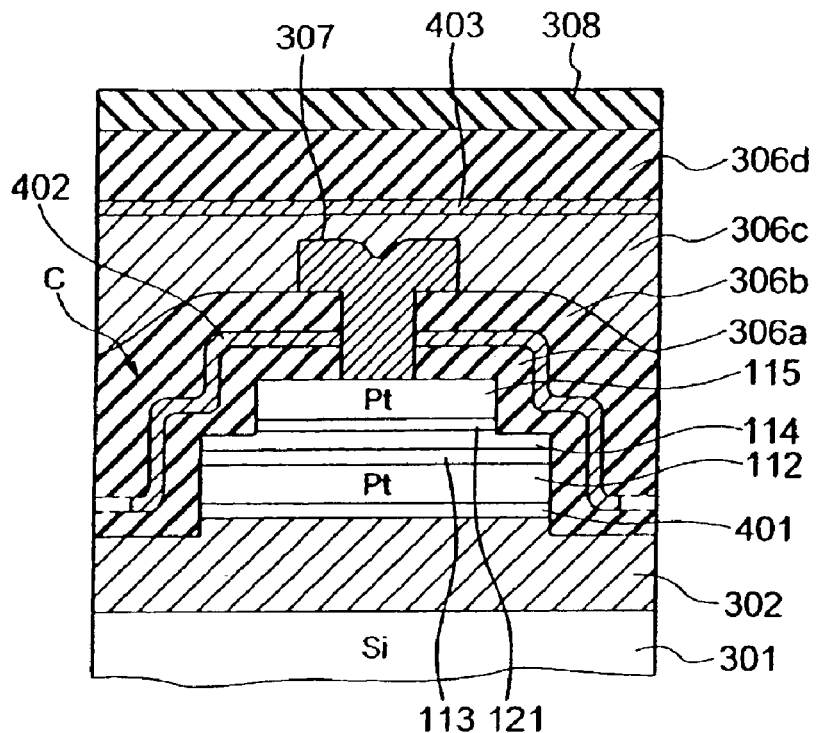
FIG. 42 is a sectional view showing an embodiment which is a combination of structures of FIG. 29A and FIG. 19.

FIG. 42 is a sectional view showing an embodiment which is a combination of structures of FIG. 29A and FIG. 19. In this embodiment, the capacitor has a double barrier structure and stack of three layers of PZT.

Figure 43:
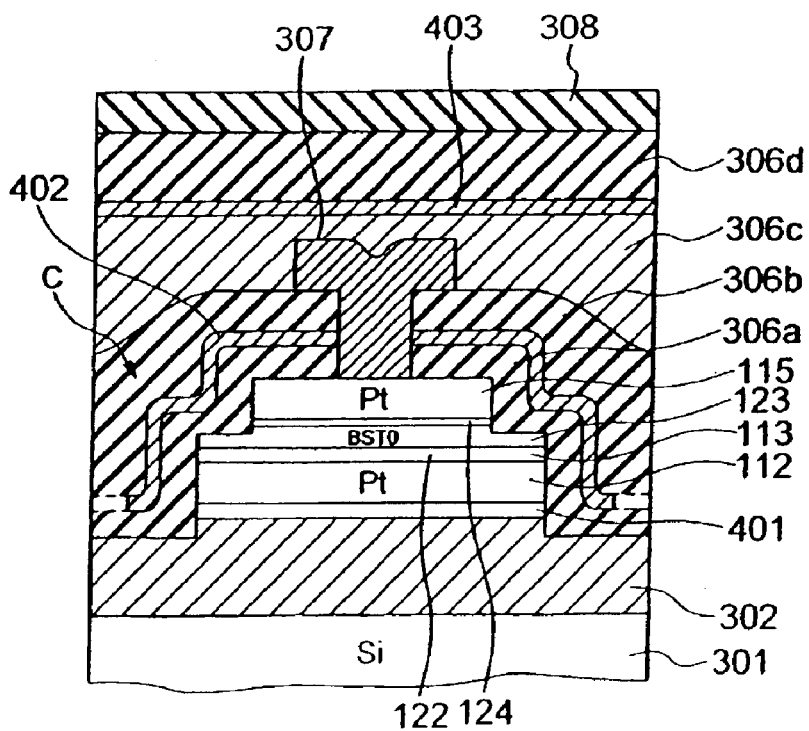
FIG. 43 is a sectional view showing an embodiment which is a combination of structures of FIG. 29A and FIG. 23.

FIG. 43 is a sectional view showing an embodiment which is a combination of structures of FIG. 29A and FIG. 23. In this embodiment, the capacitor has a double barrier structure and stack of three layers of BSTO.

Figure 44:
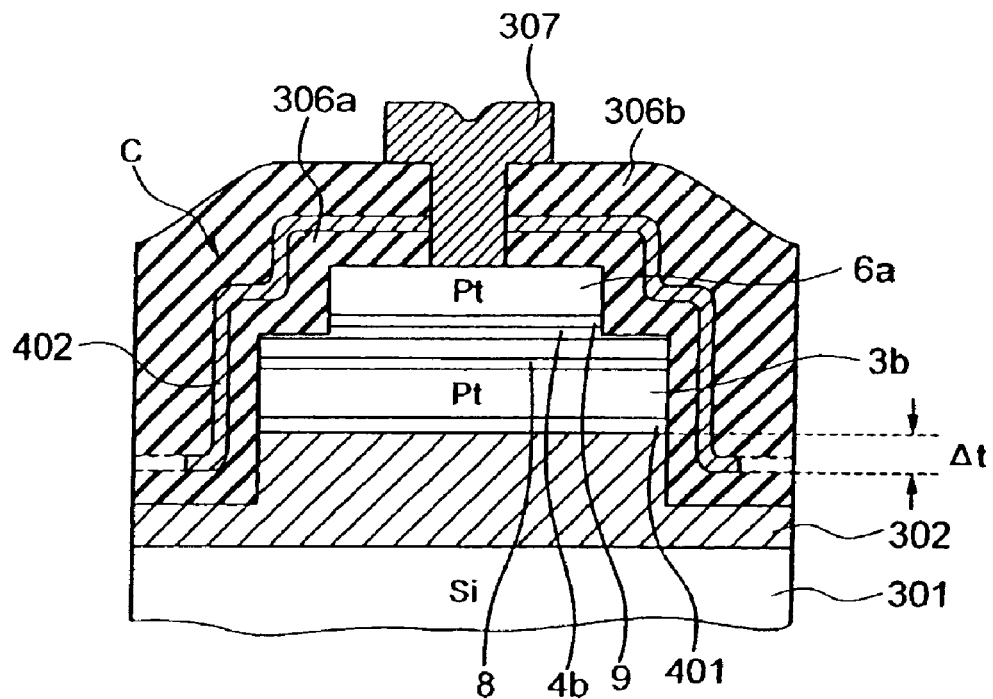
FIG. 44 is a sectional view showing an embodiment which is a combination of structures of FIG. 30A and FIG. 11.

FIG. 44 is a sectional view showing an embodiment which is a combination of structures of FIG. 30A and FIG. 11. In this embodiment, the capacitor has a stepwise configuration and a barrier with its extending portions being lower than the stack structure of two layers of PZT and two titanium films.

Figure 45:
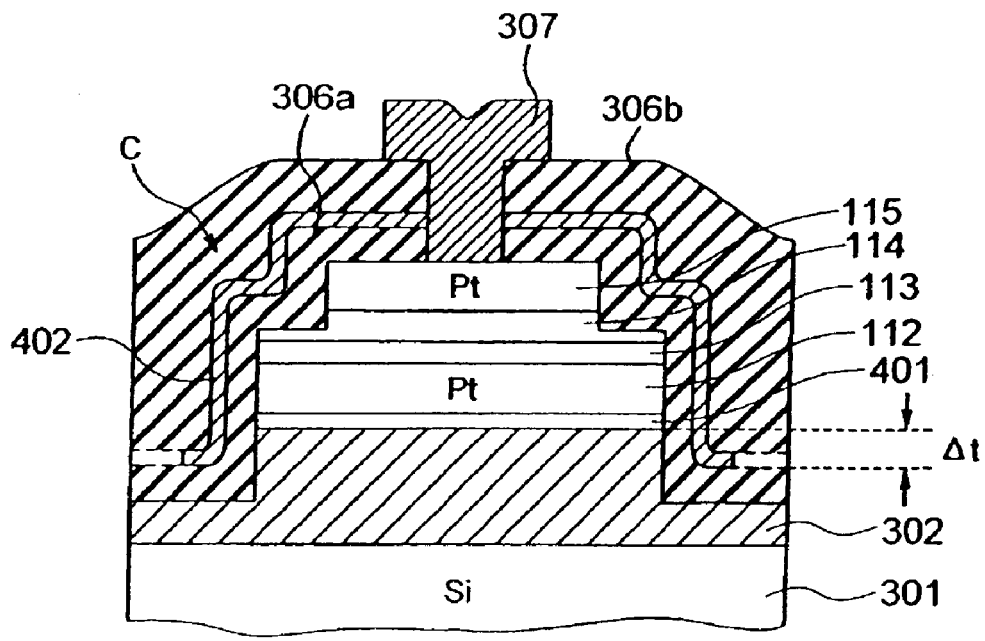
FIG. 45 is a sectional view showing an embodiment which is a combination of structures of FIG. 30A and FIG. 13.

FIG. 45 is a sectional view showing an embodiment which is a combination of structures of FIG. 30A and FIG. 13. In this embodiment, the capacitor has a stepwise configuration and a barrier with its extending portions being lower than the stack structure of two layers of PZT.

Figure 46:
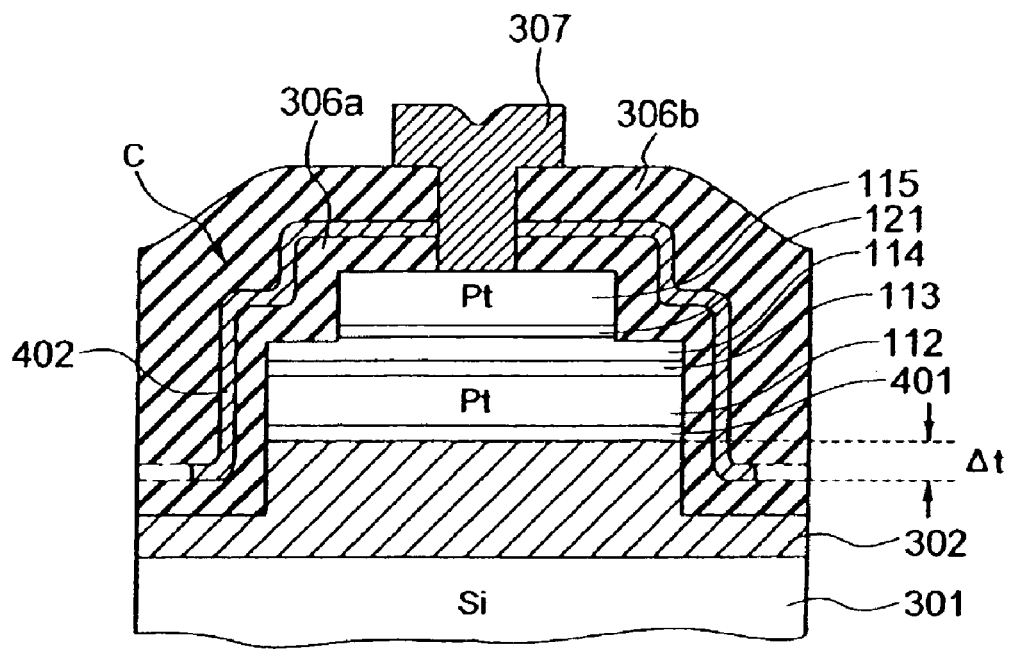
FIG. 46 is a sectional view showing an embodiment which is a combination of structures of FIG. 30A and FIG. 19.

FIG. 46 is a sectional view showing an embodiment which is a combination of structures of FIG. 30A and FIG. 19. In this embodiment, the capacitor has a stepwise configuration and a barrier with its extending portions being lower than the stack structure of three layers of PZT.

Figure 47:
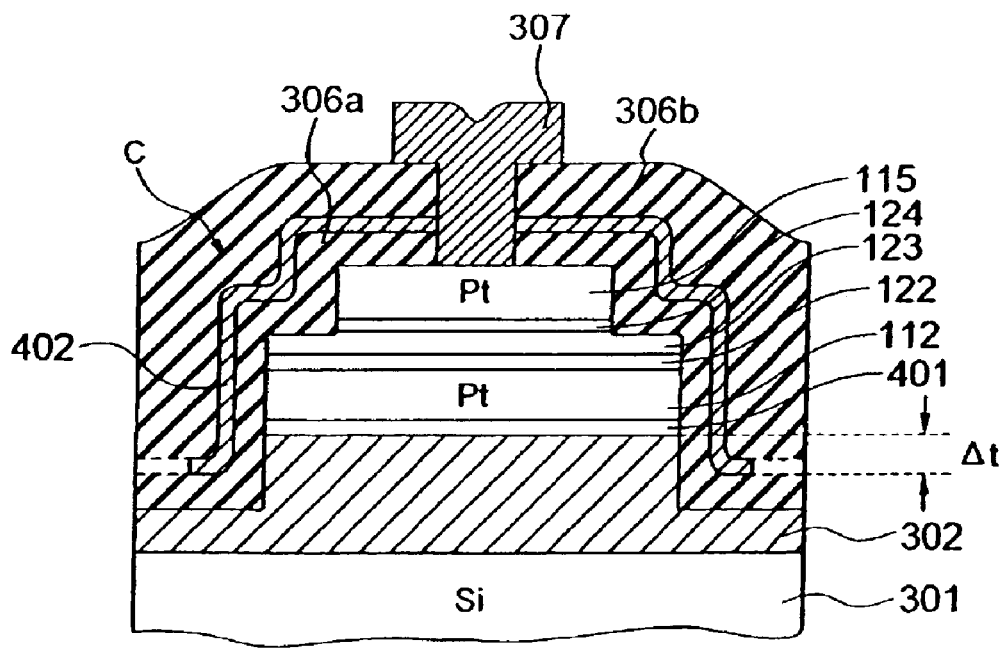
FIG. 47 is a sectional view showing an embodiment which is a combination of structures of FIG. 30A and FIG. 23.

FIG. 47 is a sectional view showing an embodiment which is a combination of structures of FIG. 20A and FIG. 23. In this embodiment, the capacitor has a stepwise configuration and a barrier with its extending portions being lower than the stack structure of three layers of BSTO.

Figure 48:
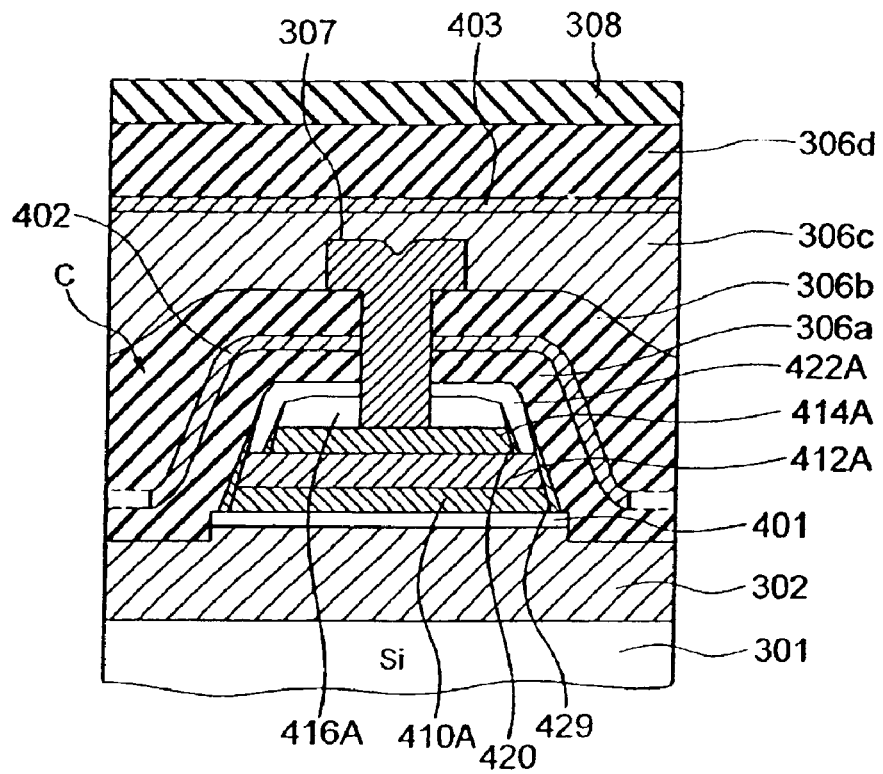
FIG. 48 is a sectional view showing an embodiment which is a combination of structures of FIG. 29A and FIG. 31G.

FIG. 48 is a sectional view showing an embodiment which is a combination of structures of FIG. 29A and FIG. 31G. In this embodiment, since the capacitor has double insulation films 416A and 422A, residual fences 420 and 429 will not cause a short-circuit.

Figure 31H:
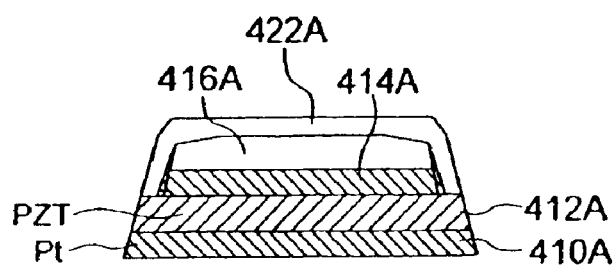
FIG. 31H is a sectional view showing a structure corresponding to FIG. 31G, in which fences are completely removed.
Figure 49:
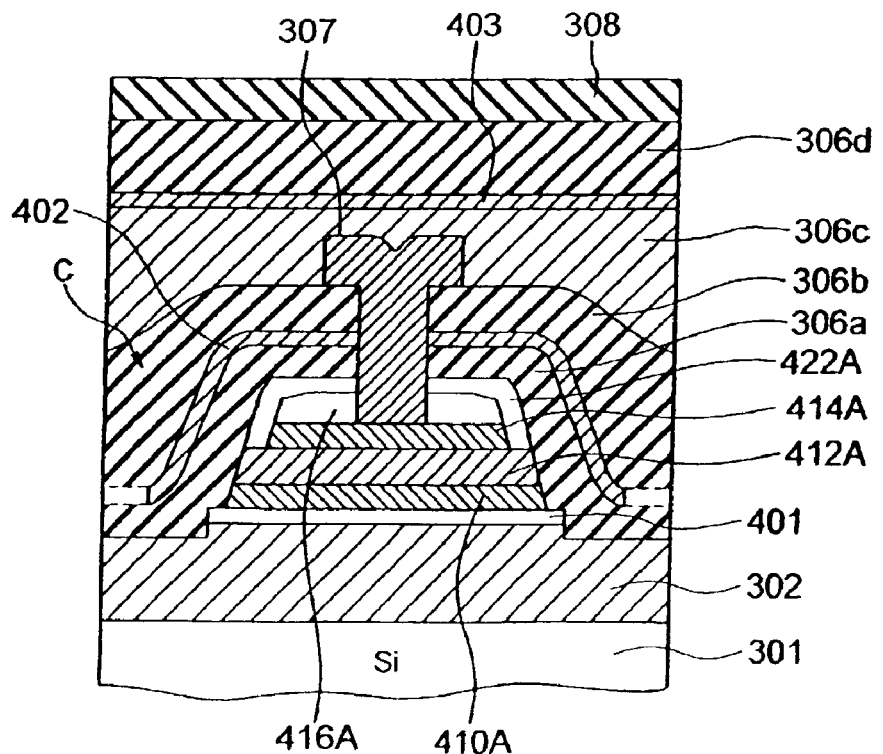
FIG. 49 is a sectional view showing an embodiment which is a combination of structures of FIG. 29A and FIG. 31H.

FIG. 49 is a sectional view showing an embodiment which is a combination of structures of FIG. 29A and FIG. 31H. In this embodiment, residual fences are thoroughly removed, which will decrease the possibility of short-circuit.

Figure 50:
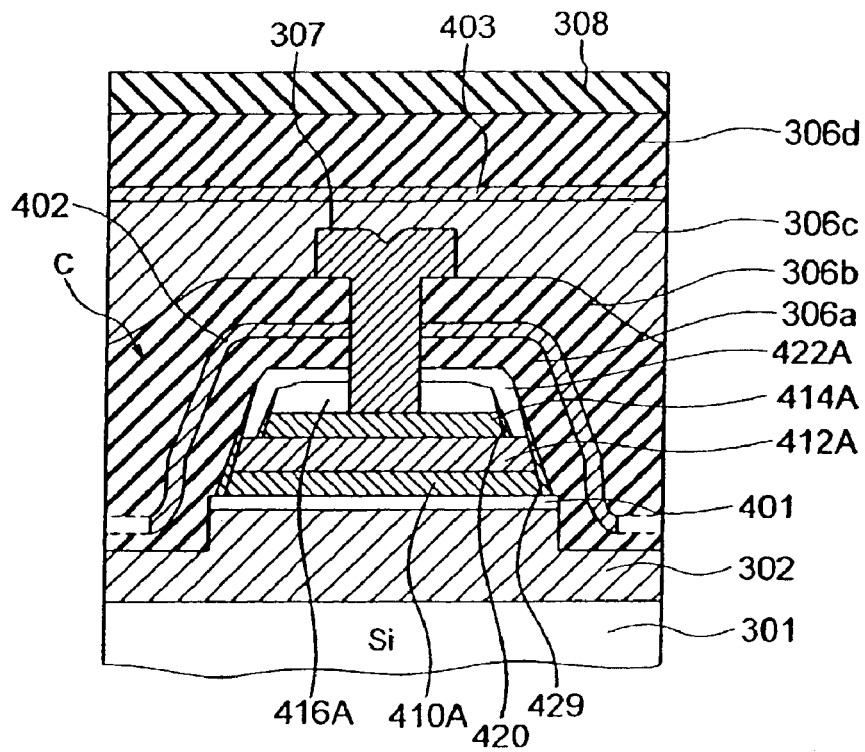
FIG. 50 is a sectional view showing an embodiment which is a variation of the combination of structures of FIG. 29A and FIG. 31G.

FIG. 50 is a sectional view showing an embodiment which is a variation of the combination of structures of FIG. 29A and FIG. 31G. This embodiment is similar to the embodiment of FIG. 48, but the hydrogen barrier film extends to the level lower than the bottom electrode.

Figure 51:
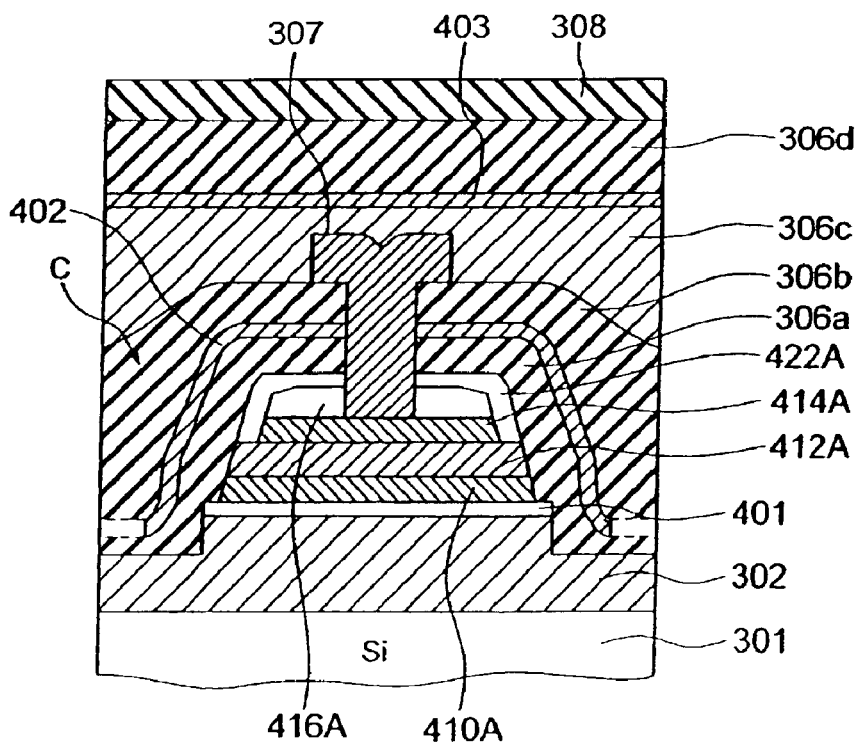
FIG. 51 is a sectional view showing an embodiment which is a variation of the combination of structures of FIG. 29A and FIG. 31H.

FIG. 51 is a sectional view showing an embodiment which is a variation of the combination of structures of FIG. 29A and FIG. 31H. This embodiment is similar to the embodiment of FIG. 49, but the hydrogen barrier film extends to the level lower than the bottom electrode.

Figure 52:
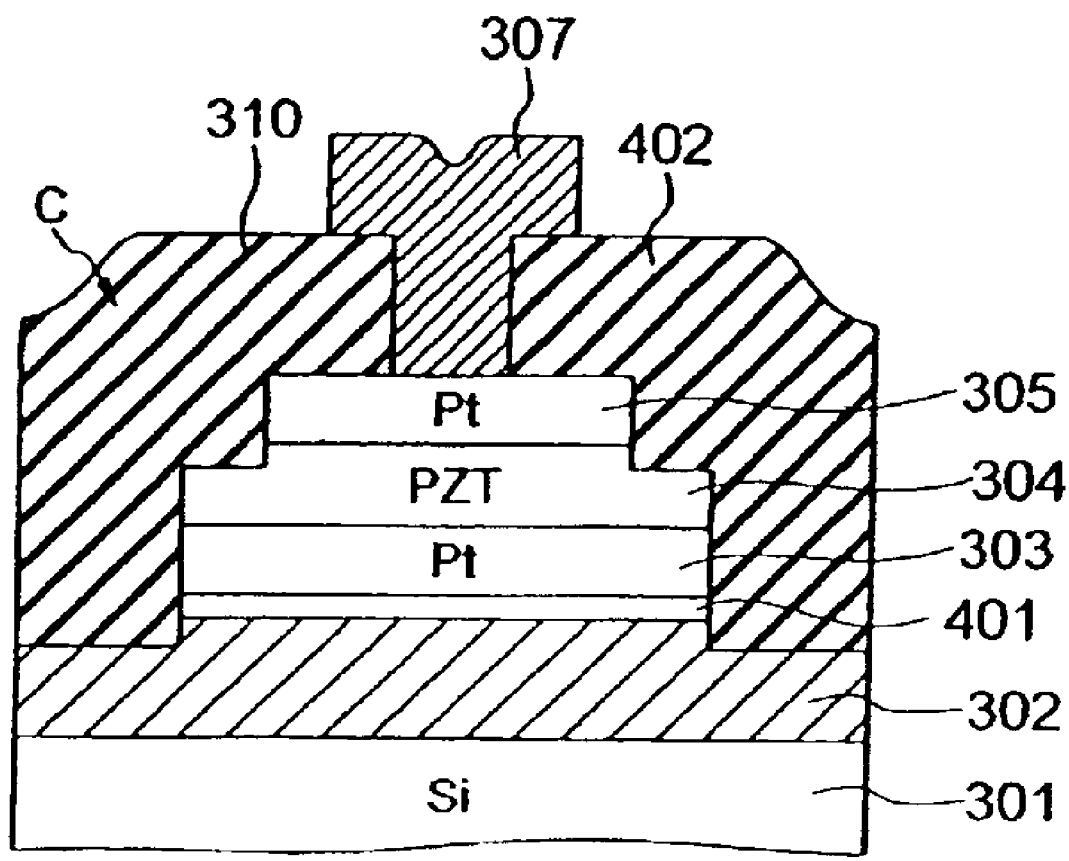
FIG. 52 is a sectional view showing an embodiment in which an interlayer insulator material containing metal oxide is used.

FIG. 52 is a sectional view showing an embodiment in which an interlayer insulator material containing metal oxide is used. Material used here is preferably at least one selected from the group consisting of $Al_xO_y$, $TiO_x$, $ZrO_x$, $MgO_x$, $PbO_x$, $BiO_x$ and $MgTiO_x$.

When such an interlayer insulator is employed, the metal oxide functions as a hydrogen barrier. Accordingly, good behavior is attained without using the hydrogen barrier film.

While the present invention has been disclosed in terms of the preferred embodiment in order to facilitate better understanding thereof, it should be appreciated that the invention can be embodied in various ways without departing from the principle of the invention and that the invention should be understood to include all possible embodiments an modification to the shown embodiments.

Therefore, the present invention should not be limited to the above described preferred embodiments. For example, the protective film may be formed of an insulator film at least one selected from the group consisting of $Al_xO_y$, $TiO_x$, $ZrO_x$, $MgO_x$ and $MgTiO_x$. In addition, the ferroelectric film may be formed of SBT ($SrBi_2Ta_2O_9$) other than the PZT.

What is claimed is:

1. A semiconductor memory device comprising:
    a semiconductor substrate;
    a first insulator film formed on said substrate;
    a ferroelectric capacitor having a bottom electrode, a ferroelectric film and a top electrode, which are sequentially stacked on said first insulator film, said ferroelectric film being patterned on said bottom electrode having a predetermined pattern so as to have an area smaller than an area of said bottom electrode;
    a first interlayer insulation layer covering the ferroelectric capacitor; and
    a first hydrogen barrier film deposited on the first interlayer insulation layer so that at least a top and side of said ferroelectric capacitor are enveloped by said first interlayer insulation layer, and said first hydrogen barrier film,
    wherein said ferroelectric capacitor further comprises a second insulator film formed only directly on said top electrode, and a third insulator film formed to cover said second insulator film and sides of said top electrode; and
    wherein said second and third insulator films are formed between the ferroelectric capacitor and the first interlayer insulation layer.

2. The semiconductor memory device as set forth in claim 1, wherein a first residual of the top electrode material remains on a side of said top electrode and a second residual of the bottom electrode material remains on a side of the ferroelectric film.

3. The semiconductor memory device as set forth in claim 1, further comprising:
    a second interlayer insulation layer covering said first hydrogen barrier film; and
    a second hydrogen barrier film deposited on said second interlayer insulation layer.

4. The semiconductor memory device as set forth in claim 1, wherein an extending portion of said first hydrogen barrier film is at substantially the same level as said first insulator film.

5. The semiconductor memory device as set forth in claim 1, wherein an extending portion of said first hydrogen barrier film is at a lower level than said first insulator film.

6. The semiconductor memory device as set forth in claim 1, wherein an end portion of said first hydrogen barrier film extends to adjacent element regions.

7. The semiconductor memory device as set forth in claim 1, wherein said second and third insulator films are silicon oxide films.

8. The semiconductor memory device as set forth in claim 1, wherein said ferroelectric film is made of a plurality of stacked layers of perovskite compound including at least one of lead or bismuth.

9. The semiconductor memory device as set forth in claim 8, wherein said stacked layers have two layers of perovskite compound, a lower layer having a lower concentration of elements contained in the top electrode than an upper layer.

10. The semiconductor memory device as set forth in claim 8, wherein said stacked layers have two layers of perovskite compound, an upper layer having a lower concentration of elements contained in the bottom electrode than a lower layer.

11. The semiconductor memory device as set forth in claim 8, wherein said stacked layers have three layers of perovskite compound, and an intermediate layer has a lower concentration of elements contained in the top and bottom electrodes than a lower layer and an upper layer.

12. The semiconductor memory device as set forth in claim 1, wherein said first interlayer insulation layer prevents said hydrogen barrier film from direct contact with said ferroelectric film and said bottom electrode.

* * * * *